(12) United States Patent
Manassen et al.

(10) Patent No.: US 12,235,588 B2
(45) Date of Patent: Feb. 25, 2025

(54) SCANNING OVERLAY METROLOGY WITH HIGH SIGNAL TO NOISE RATIO

(71) Applicant: KLA Corporation, Milpitas, CA (US)

(72) Inventors: Amnon Manassen, Haifa (IL); Andrew V. Hill, Sunriver, OR (US); Vladimir Levinski, Migdal HaEmek (IL)

(73) Assignee: KLA Corporation, Milpitas, CA (US)

( * ) Notice: Subject to any disclaimer, the term of this patent is extended or adjusted under 35 U.S.C. 154(b) by 163 days.

(21) Appl. No.: 18/110,746

(22) Filed: Feb. 16, 2023

(65) Prior Publication Data

US 2024/0280914 A1 Aug. 22, 2024

(51) Int. Cl.
  G03F 7/00 (2006.01)
  G01B 9/02 (2022.01)
  G01B 11/27 (2006.01)

(52) U.S. Cl.
  CPC ..... *G03F 7/70633* (2013.01); *G01B 9/02043* (2013.01); *G01B 9/02084* (2013.01); *G01B 11/272* (2013.01)

(58) Field of Classification Search
  CPC .............. G01B 11/272; G01B 2210/56; G01B 9/02043; G01B 9/02084; G03F 7/70633; G03F 7/70683
  See application file for complete search history.

(56) References Cited

U.S. PATENT DOCUMENTS

| | | | |
|---|---|---|---|
| 4,947,413 A | 8/1990 | Jewell et al. | |
| 5,216,257 A | 6/1993 | Brueck et al. | |
| 5,414,514 A | 5/1995 | Smith et al. | |
| 5,808,731 A | 9/1998 | Kirk | |
| 5,895,735 A | 4/1999 | Yoon | |
| 5,914,204 A | 6/1999 | Lee | |
| 6,958,819 B1 | 10/2005 | Heaton et al. | |
| 7,247,843 B1 | 7/2007 | Moon | |
| 7,440,105 B2 | 10/2008 | Adel et al. | |
| 7,602,491 B2 | 10/2009 | Kandel et al. | |
| 7,671,990 B1 | 3/2010 | Adel et al. | |

(Continued)

FOREIGN PATENT DOCUMENTS

| | | |
|---|---|---|
| CN | 104346808 A | 2/2015 |
| CN | 111766764 A | 10/2020 |

(Continued)

OTHER PUBLICATIONS

U.S. Appl. No. 17/708,958 filed Mar. 30, 2022, Manassen et al.

(Continued)

*Primary Examiner* — Deoram Persaud
(74) *Attorney, Agent, or Firm* — Suiter Swantz IP

(57) ABSTRACT

An overlay metrology system may include illumination optics to split illumination from an illumination source into primary and secondary illumination and direct the primary illumination to a sample including an overlay target with gratings in two or more layers and an objective lens to collect positive and negative diffraction from the constituent gratings. The system may further include collection optics to overlap the auxiliary illumination with at least some of the collected diffraction lobes to generate time-varying interference signals. The system may further include a controller to generate overlay measurements based on the time-varying interference signals.

21 Claims, 10 Drawing Sheets

(56) References Cited

U.S. PATENT DOCUMENTS

| | | | |
|---|---|---|---|
| 8,786,825 B2 | 7/2014 | Kerkhof et al. | |
| 9,123,649 B1 | 9/2015 | Manassen et al. | |
| 9,864,209 B2 | 1/2018 | Levinski et al. | |
| 9,885,961 B1 | 2/2018 | Amir | |
| 10,197,389 B2 | 2/2019 | Levinski et al. | |
| 10,268,125 B2 | 4/2019 | Peng et al. | |
| 10,437,163 B2 | 10/2019 | Schaar et al. | |
| 10,488,768 B2 | 11/2019 | Auer et al. | |
| 10,527,952 B2 | 1/2020 | Grunzweig et al. | |
| 10,585,357 B2 | 3/2020 | Schaar et al. | |
| 10,606,178 B2 | 3/2020 | Zwier | |
| 10,691,030 B2 | 6/2020 | Staals et al. | |
| 10,824,079 B2 | 11/2020 | Lubashevsky et al. | |
| 10,983,005 B2 | 4/2021 | Wu et al. | |
| 11,073,768 B2 | 7/2021 | Hill et al. | |
| 11,112,369 B2 | 9/2021 | Gready | |
| 11,119,417 B2 | 9/2021 | Manassen et al. | |
| 11,164,307 B1 | 11/2021 | Feler et al. | |
| 11,300,405 B2 | 4/2022 | Manassen et al. | |
| 11,300,524 B1 | 4/2022 | Hill et al. | |
| 11,353,799 B1 | 6/2022 | Volkovich et al. | |
| 11,378,394 B1 | 7/2022 | Paskover et al. | |
| 11,409,205 B2 | 8/2022 | Gdor et al. | |
| 11,428,642 B2 | 8/2022 | Hill et al. | |
| 11,526,086 B2 | 12/2022 | Hill et al. | |
| 11,604,149 B2 | 3/2023 | Feler | |
| 11,796,925 B2 | 10/2023 | Lubashevsky et al. | |
| 11,800,212 B1* | 10/2023 | Vaknin | G03F 7/70653 |
| 12,066,322 B2* | 8/2024 | Manassen | G03F 7/70316 |
| 2001/0021477 A1 | 9/2001 | Dirksen et al. | |
| 2002/0080364 A1 | 6/2002 | Monshouwer et al. | |
| 2004/0169861 A1 | 9/2004 | Mieher et al. | |
| 2005/0195398 A1 | 9/2005 | Adel et al. | |
| 2007/0077503 A1 | 4/2007 | Yoo | |
| 2007/0234786 A1 | 10/2007 | Moon | |
| 2007/0242272 A1 | 10/2007 | Suehira et al. | |
| 2007/0279630 A1 | 12/2007 | Kandel et al. | |
| 2009/0042108 A1 | 2/2009 | Yasuzato | |
| 2010/0267682 A1 | 10/2010 | Johri et al. | |
| 2010/0277706 A1 | 11/2010 | Schaar et al. | |
| 2011/0122496 A1 | 5/2011 | Schaar et al. | |
| 2012/0033193 A1 | 2/2012 | Schaar et al. | |
| 2012/0253325 A1 | 10/2012 | Sniffin et al. | |
| 2013/0032712 A1 | 2/2013 | Shih et al. | |
| 2013/0193602 A1 | 8/2013 | Suzuki et al. | |
| 2013/0252429 A1 | 9/2013 | Okamoto et al. | |
| 2014/0065736 A1 | 3/2014 | Amir et al. | |
| 2014/0240704 A1 | 8/2014 | Komine et al. | |
| 2015/0138523 A1 | 5/2015 | Jak et al. | |
| 2015/0177135 A1 | 6/2015 | Amit et al. | |
| 2015/0235880 A1 | 8/2015 | Inada et al. | |
| 2015/0293458 A1 | 10/2015 | Vanoppen et al. | |
| 2016/0047744 A1 | 2/2016 | Adel et al. | |
| 2016/0093574 A1 | 3/2016 | Cai et al. | |
| 2016/0146740 A1 | 5/2016 | Lu et al. | |
| 2016/0223920 A1 | 8/2016 | Tinnemans et al. | |
| 2016/0300767 A1 | 10/2016 | Ko et al. | |
| 2017/0146338 A1 | 5/2017 | Allen | |
| 2017/0307367 A1 | 10/2017 | Yaegashi et al. | |
| 2017/0351184 A1 | 12/2017 | Peng et al. | |
| 2018/0003630 A1* | 1/2018 | Grunzweig | G01N 21/4788 |
| 2018/0024054 A1 | 1/2018 | Moon et al. | |
| 2018/0246420 A1 | 8/2018 | Pandey et al. | |
| 2019/0004439 A1 | 1/2019 | Lubashevsky et al. | |
| 2019/0033726 A1 | 1/2019 | Adam et al. | |
| 2019/0049373 A1 | 2/2019 | Levinski | |
| 2019/0101835 A1 | 4/2019 | Chen | |
| 2019/0219931 A1 | 7/2019 | Zwier | |
| 2019/0285996 A1 | 9/2019 | Shibayama et al. | |
| 2019/0310080 A1* | 10/2019 | Hill | G03F 9/7034 |
| 2019/0354024 A1 | 11/2019 | Tsiatmas et al. | |
| 2020/0132446 A1 | 4/2020 | Shalibo et al. | |
| 2020/0241429 A1 | 7/2020 | Yang et al. | |
| 2021/0072650 A1 | 3/2021 | Feler et al. | |
| 2021/0364279 A1 | 11/2021 | Manassen et al. | |
| 2021/0364935 A1 | 11/2021 | Gdor et al. | |
| 2022/0034652 A1 | 2/2022 | Manassen et al. | |
| 2022/0252990 A1 | 8/2022 | Javaheri et al. | |
| 2023/0133640 A1 | 5/2023 | Hill et al. | |
| 2023/0213875 A1 | 7/2023 | Lubashevsky et al. | |
| 2023/0314319 A1 | 10/2023 | Manassen et al. | |
| 2023/0314344 A1 | 10/2023 | Paskover et al. | |
| 2024/0068804 A1 | 2/2024 | Lubashevsky et al. | |
| 2024/0167813 A1 | 5/2024 | Gdor et al. | |
| 2024/0302751 A1 | 9/2024 | Pio et al. | |
| 2024/0337952 A1 | 10/2024 | Gdor et al. | |
| 2024/0337953 A1 | 10/2024 | Gdor et al. | |

FOREIGN PATENT DOCUMENTS

| | | |
|---|---|---|
| CN | 114690585 A | 7/2022 |
| JP | 214765 Y1 | 8/1998 |
| JP | 10214765 A | 11/1998 |
| JP | 2001093820 A | 4/2001 |
| JP | 2002134394 A | 5/2002 |
| JP | 2007140460 | 2/2009 |
| JP | 2010267682 A | 11/2010 |
| JP | 2011243664 A | 12/2011 |
| JP | 2012253325 A | 12/2012 |
| JP | 2013074258 A | 4/2013 |
| JP | 2013254780 | 7/2015 |
| JP | 2015154008 A | 8/2015 |
| JP | 2021131348 A | 9/2021 |
| KR | 101185992 B1 | 9/2012 |
| KR | 20150121275 A | 10/2015 |
| KR | 1020160121206 A | 10/2016 |
| KR | 1020210031015 A | 3/2021 |
| WO | 2021216796 A1 | 10/2021 |

OTHER PUBLICATIONS

U.S. Appl. No. 17/709,104 filed Mar. 30, 2022, Lubashevsky et al.
U.S. Appl. No. 18/099,798 filed Jan. 20, 2023, Gdor et al.
Zhou et al., "Moiré-Based Interferometry for Magnification Calibration of Bitelecentric Lens System," IEEE Photonics Journal, vol. 7, No. 6, Dec. 2015, 12 pages.
U.S. Appl. No. 18/230,542 filed Aug. 4, 2023, Jordan Pio.
U.S. Appl. No. 18/234,773 filed Aug. 16, 2023, Yuval Lubashevsky.
U.S. Appl. No. 18/372,444 filed Sep. 25, 2023, Itay Gdor.
U.S. Appl. No. 18/372,531 filed Sep. 25, 2023, Itay Gdor.
Adel et al., "Diffraction order control in overlay metrology: a review of the roadmap options," Proc. SPIE. 6922, Metrology, Inspection, and Process Control for Microlithography XXII, pp. 692202-1 to 692202-19, Apr. 2008.
Buttgereit, et al., "Phame(R)—high resolution off-axis phase shift measurements on 45nm node features," 24th European Mask and Lithography Conference, 2008, pp. 1-7, doi: 10.1117/12.798805.
Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.
Fesperman Jr., Ronnie Rex, (2006). Multiscale Alignment and Positioning System. (UMI 3264369) [Doctor of Philosophy, University of North Carolina] ProQuest Information and Learning Company.
International Search Report and Written Report in International Application No. PCT/US2021/061296 dated Mar. 24, 2022, 9 pages.
Kikuchi et al., "Principle and observation of fluorescence moiré fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.
Korean Intellectual Property Office, International Search Report and Written Opinion for International Application No. PCT/US2022/052061, Apr. 24, 2023, 10 pages.
Korean Intellectual Property Office, International Search Report and Written Opinion for International Application No. PCT/US2023/013654, Jun. 8, 2023, 12 pages.

(56) References Cited

OTHER PUBLICATIONS

Korean Intellectual Property Office, International Search Report and Written Opinion for International Application No. PCT/US2023/014005, Jun. 16, 2023, 8 pages.

Moon, et al., "Immunity to Signal Degradation by Overlayers Using a Novel Spatial-Phase-Matching Alignment System", J. Vac. Sci. Technol. B 13, 2648-2652 (1995).

PCT International Search Report and Written Opinion for International Application No. PCT/US2021/044111 dated Nov. 22, 2022, 9 pages.

Servin, et al., "Mask contribution on CD & OVL errors budgets for Double Patterning Lithography," 25th European Mask and Lithography Conference, 2009, pp. 1-13.

Wu, et al., (2012). Nanoimprint lithography with ≤60 nm overlay precision. Applied Physics A, 106, 767-772.

Zhou, et al., (2015). Moiré-Based Interferometry for Magnification Calibration of Bitelecentric Lens System. IEEE Photonics Journal. 7. 1-11. 10.1109/JPHOT.2015.2500892.

Zhou, et al., "Fourier-based analysis of moiré fringe patterns of superposed gratings in alignment of nanolithography", Optics Express, vol. 16, No. 11, p. 7869, 2008. doi:10.1364/OE. 16.007869.

Zhu et al. Four-quadrant gratings moiré fringe alignment measurement in proximity lithography. Optics Express. Feb. 2013;21(3):3463-3473. DOI: 10.1364/oe.21.003463. PMID: 23481804.

Zhu, et al., (2015). Adjustment Strategy for Inclination Moiré Fringes in Lithography by Spatial Frequency Decomposition. IEEE Photonics Technology Letters. 27. 395-398. 10.1109/LPT.2014.2370072.

Korean Intellectual Property Office, International Search Report and Written Opinion received in International Application No. PCT/US2024/015081, Jun. 4, 2024, 8 pages.

\* cited by examiner

SCANNING OVERLAY METROLOGY WITH HIGH SIGNAL TO NOISE RATIO

TECHNICAL FIELD

The present disclosure relates generally to overlay metrology and, more particularly, to scanning overlay metrology based on scatterometry techniques.

BACKGROUND

Increasing demands for smaller semiconductor devices is resulting in a corresponding increased demand for accurate and efficient metrology. One approach to increasing the efficiency and throughput of a metrology tool is to generate metrology data on a sample as it is in motion rather than in a static location in a measurement field of view. In this way, time delays associated with settling of the translation stage prior to a measurement may be eliminated or reduced. However, increasing the sensitivity and throughput of such measurements remains a central challenge to such scanning metrology methods. Therefore, it is desirable to provide systems and methods for curing the above deficiencies.

SUMMARY

An overlay metrology system is disclosed in accordance with one or more illustrative embodiments. In one illustrative embodiment, the system includes an illumination source. In another illustrative embodiment, the system includes a first beamsplitter configured to split illumination from the illumination source into primary illumination and auxiliary illumination. In another illustrative embodiment, the system includes one or more illumination optics configured to direct the primary illumination to an overlay target on a sample when implementing a metrology recipe, where the overlay target in accordance with the metrology recipe includes gratings in two or more layers. In another illustrative embodiment, the system includes an objective lens to collect at least one positive diffraction lobe and at least one negative diffraction lobe associated with diffraction of the primary illumination from the gratings in each of the two or more layers when implementing the metrology recipe. In another illustrative embodiment, the system includes one or more photodetectors in one or more collection pupil planes. In another illustrative embodiment, the system includes one or more collection optics configured to implement the metrology recipe by overlapping a first portion of the auxiliary illumination with at least one diffraction lobe of the primary illumination by the overlay target on at least one of the one or more photodetectors to generate a first interference pattern, and overlapping a second portion of the auxiliary illumination with at least one additional diffraction lobe of the primary illumination by the overlay target on at least one of the one or more photodetectors to generate a second interference pattern. In another illustrative embodiment, the system includes a scanning sub-system including at least one of a stage or one or more scanning optics to modulate phases of the first and second interference patterns during a scan of the overlay target when implementing the metrology recipe. In another illustrative embodiment, the system includes a controller to receive time-varying interference signals from the one or more photodetectors during the scan of the overlay target and generate one or more overlay measurements of the overlay target based on the time-varying interference signals.

An overlay metrology method is disclosed in accordance with one or more illustrative embodiments. In one illustrative embodiment, the method includes generating illumination with an illumination source. In another illustrative embodiment, the method includes splitting the illumination from the illumination source into primary illumination and auxiliary illumination. In another illustrative embodiment, the method includes directing the primary illumination to an overlay target on a sample, wherein the overlay target includes gratings in two or more layers. In another illustrative embodiment, the method includes overlapping a first portion of the auxiliary illumination with at least one diffraction lobe associated with diffraction of the primary illumination from the gratings in each of the two or more layers on one or more first photodetectors in a collection pupil plane to generate a first interference pattern. In another illustrative embodiment, the method includes overlapping a second portion of the auxiliary illumination with at least one additional diffraction lobe associated with diffraction of the primary illumination from the gratings in each of the two or more layers on one or more second photodetectors in the collection pupil plane to generate a second interference pattern. In another illustrative embodiment, the method includes modulating phases of the first and second interference patterns during a scan of the overlay target with a scanning sub-system, where the scanning sub-system includes at least one of a translation stage to scan the sample with respect to the primary illumination, beam-scanning optics to scan the primary illumination with respect to the sample, or a phase modulator to modulate a phase of the auxiliary illumination. In another illustrative embodiment, the method includes generating time-varying interference signals with the one or more first photodetectors and the one or more second photodetectors based the modulated phases of the first and second interference patterns. In another illustrative embodiment, the method includes generating one or more overlay measurements of the overlay target based on the time-varying interference signals.

An overlay metrology system is disclosed in accordance with one or more illustrative embodiments. In one illustrative embodiment, the system includes an illumination source configured to generate an illumination. In another illustrative embodiment, the system includes one or more beamsplitters configured to split the illumination from the illumination source into primary illumination and auxiliary illumination. In another illustrative embodiment, the system includes one or more illumination optics configured to direct the primary illumination to an overlay target on a sample to the overlay target having gratings in two or more layers when implementing a metrology recipe, where the overlay target in accordance with the metrology recipe include a first set of one or more cells with gratings having a first grating direction and a second set of one or more cells with gratings having a second grating direction, and where the primary illumination has a rotated quadrupole distribution with respect to the first and second grating directions. In another illustrative embodiment, the system includes an objective lens to collect at least one positive diffraction lobe and at least one negative diffraction lobe associated with diffraction of the primary illumination from the gratings in each of the two or more layers when implementing the metrology recipe. In another illustrative embodiment, the system includes a first collection channel with a first set of one or more photodetectors in one or more collection pupil planes. In another illustrative embodiment, the first collection channel is configured to implement the metrology recipe by overlapping a first portion of the auxiliary illumination with at least one diffraction lobe of the primary illumination along a first diagonal of the rotated quadrupole distribution by the overlay target on at least one of the first set of one or more photodetectors to generate a first interference pattern, and overlapping a second portion of the auxiliary illumination with at least one additional diffraction lobe of the primary illumination along a first diagonal of the rotated quadrupole distribution by the overlay target on at least one of the first set of one or more photodetectors to generate a second interference pattern. In another illustrative embodiment, the system includes a second collection channel with a second set of one or more photodetectors in one or more collection pupil planes. In another illustrative embodiment, the second collection channel is configured to implement the metrology recipe by overlapping a first portion of the auxiliary illumination with at least one diffraction lobe of the primary illumination along a second diagonal of the rotated quadrupole distribution by the overlay target on the at least one of the second set of one or more photodetectors to generate a third interference pattern, and overlapping a second portion of the auxiliary illumination with at least one additional diffraction lobe of the primary illumination along a second diagonal of the rotated quadrupole distribution by the overlay target on at least one of the second set of one or more photodetectors to generate a fourth interference pattern. In another illustrative embodiment, the system includes a scanning sub-system configured to modulate phases of the first, second, third, and fourth interference patterns during a scan of the overlay target when implementing the metrology recipe, where the scanning sub-system includes at least one of a translation stage to scan the sample with respect to the primary illumination, beam-scanning optics to scan the primary illumination with respect to the sample, or a phase modulator to modulate a phase of the auxiliary illumination. In another illustrative embodiment, the system includes a controller to receive time-varying interference signals from the first and second collection channels during the scan of the overlay target and generate one or more overlay measurements of the overlay target along the first and second grating directions based on the time-varying interference signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
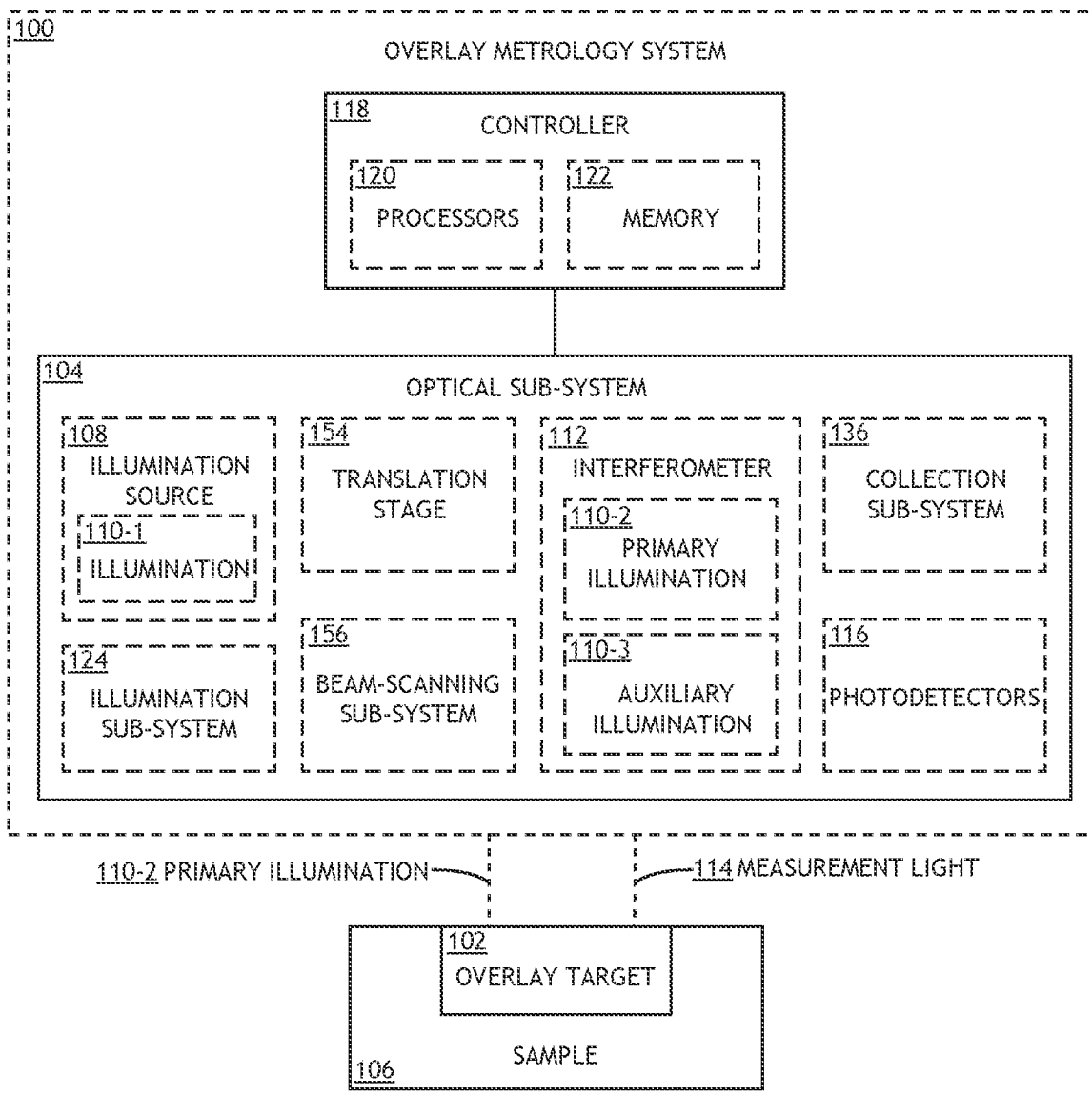
FIG. 1A is a conceptual view of an overlay metrology system for performing scatterometry overlay metrology on an overlay target suitable for overlay measurements along any particular measurement direction, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scanning scatterometry overlay based on time-varying interference signals generated by interfering one or more diffraction orders of a grating-over-grating overlay target with reference light (e.g., auxiliary illumination herein). It is contemplated that the systems and methods disclosed herein may facilitate rapid overlay measurements of a sample in motion with a high signal to noise ratio.

Some scatterometry-based overlay techniques involve illuminating an overlay target with periodic structures (e.g., grating structures) associated with different lithographic exposures and determining an overlay error associated with those exposures based on asymmetries of diffracted orders (e.g., +1 and −1 diffraction lobes). For example, phase differences between light associated with diffraction from the different grating structures may result in intensity variations in the pupil plane such as, but not limited to, interference fringes. In this way, asymmetries of the periodic structures such as, but not limited to, overlay errors may result in asymmetries in the interference fringes, which may be the basis of the overlay measurement.

Further, scanning-based scatterometry overlay measurements may be performed by scanning an illumination beam relative to an overlay target including such grating structures (or vice versa), where the illumination beam is sized to be smaller than the overlay target. In this configuration, interference patterns associated with diffraction from both grating structures may oscillate during a scan as time-varying interference signals, which may be captured using photodetectors having a sufficient bandwidth. For instance, such a technique may be implemented using relatively fast photodetectors such as, but not limited to, photodiodes, avalanche photodiodes, or the like located in a collection pupil plane. Additionally, scanning of the illumination beam with respect to the overlay target may generally be performed through motion of the overlay target, the illumination beam, or both.

Various measurement approaches have been developed based on these general principles. In a general sense, the locations of time-varying interference signals in a collection pupil may generally depend on the layout and the pitches of the grating structures of the overlay target. Scanning-based scatterometry overlay techniques are generally described in U.S. Pat. No. 11,300,405 issued on Apr. 12, 2022, U.S. Pat. No. 11,378,394 issued on Jul. 5, 2022, U.S. Pat. No. 10,197,389 issued on Feb. 5, 2019, U.S. patent application Ser. No. 17/708,958 filed on Mar. 30, 2022, U.S. patent application Ser. No. 17/709,104 filed on Mar. 30, 2022, and U.S. patent application Ser. No. 18/099,798, all of which are incorporated herein by reference in their entireties.

It is contemplated herein that it may be advantageous to capture such time-varying interference signals at locations of overlap of 0-order illumination with diffraction lobes from the constituent gratings. In this way, the 0-order illumination may operate as a reference and may facilitate the determination of asymmetries of the time-varying interference signals associated with positive and negative diffraction that may be indicative of overlay errors. However, a requirement that 0-order diffraction overlap with such higher-order diffraction in a collection pupil may impose limitations on various aspects of the overlay target or a corresponding overlay metrology system such as, but not limited to, the pitches of the constituent grating structures on the overlay target, the illumination beam wavelength, or the illumination beam shape. Further, such limitations may be inconsistent with other performance tradeoffs. For instance, it may be desirable to provide an extended illumination beam shape to mitigate the impact of target non-uniformities. However, such an extended illumination beam shape may limit the overlap areas of 0-order diffraction with higher-order diffraction lobes of interest and result a relatively low signal to noise ratio for the time-varying signals of interest.

Embodiments of the present disclosure are directed to generating time-varying interference signals indicative of overlay based on overlap of an auxiliary illumination beam (e.g., a reference beam) with diffraction lobes of interest. As an illustration, coherent illumination may be split into primary illumination and auxiliary illumination, where the primary illumination is directed to an overlay target in a scanning-based scatterometry overlay metrology system. Diffraction orders of interest from the overlay target may then be collected and overlapped with the auxiliary illumination (e.g., at a collection pupil plane). In this way, time-varying interference signals associated with positive and negative diffraction may share a common reference.

It is contemplated that the systems and methods disclosed herein may remove or mitigate constraints on the overlay target and/or the overlay metrology tool related to overlapping 0-order diffraction with selected higher-order diffraction lobes. As a result, the systems and methods disclosed herein may enable substantial flexibility in tailoring the overlay target and/or the overlay metrology tool to provide measurements with a high signal to noise ratio (SNR) as well as a high throughput.

For example, generating time-varying signals using auxiliary illumination may remove requirements that 0-order illumination overlap with higher-order diffraction lobes of interest in the pupil plane. As a result, the shape of the primary illumination (and thus the shape of the associated diffraction lobes) may be tailored to promote efficient sampling of the overlay target. As an illustration, the primary illumination may be extended along a direction orthogonal to a scan to promote interaction with an extended portion of the overlay target, which may mitigate fabrication non-uniformities without the requirements for overlap of the 0-order illumination with higher-order diffraction in the collection pupil. Instead, the auxiliary illumination may be shaped into any suitable distribution to overlap with the selected diffraction orders. Further, the pitches of the grating structures and/or the illumination wavelength may be more flexibly selected to promote smaller pitches and/or smaller targets generally.

By way of another example, generating time-varying signals using auxiliary illumination may enable the tailoring of the relative intensities of portions of the auxiliary illumination with respect to the diffraction orders of interest to promote high contrast of the time-varying interference signals. This technique may generally increase the signal to noise ratio of the captured time-varying interference signals and thus increase the sensitivity of a corresponding overlay measurement. More generally, any properties of the auxiliary illumination may be tailored for different diffraction lobes of interest such as, but not limited to, intensity, wavelength, or polarization. Such tailored auxiliary illumination is referred to herein as structured auxiliary illumination.

It is further contemplated herein that the systems and methods disclosed herein may be extended to apply to any scanning scatterometry overlay metrology technique including, but not limited to, those described in U.S. Pat. No. 11,300,405 issued on Apr. 12, 2022, U.S. Pat. No. 11,378,394 issued on Jul. 5, 2022, U.S. Pat. No. 10,197,389 issued on Feb. 5, 2019, U.S. patent application Ser. No. 17/708,958 filed on Mar. 30, 2022, U.S. patent application Ser. No. 17/709,104 filed on Mar. 30, 2022, and U.S. patent application Ser. No. 18/099,798, which are referenced above and incorporated herein in their entirety.

Additional embodiments of the present disclosure are directed to providing recipes for configuring an overlay metrology tool to facilitate an overlay measurement based on selected diffraction orders. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, or parameters for controlling one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

Further, for the purposes of the present disclosure, the term overlay target is used to generally refer to structures on a sample suitable for a particular overlay measurement. In some embodiments, an overlay target includes dedicated structures designed to facilitate an overlay measurement according to a particular technique (e.g., based on a metrology recipe). For example, a dedicated overlay target may include one or more cells with grating structures having pitches and orientations selected in accordance with a metrology recipe to provide a selected distribution of diffraction orders in a collection pupil plane. In some embodiments, an overlay target is formed from device features on a sample. For example, it may be the case that device features in some applications may be distributed in such a way that overlay measurements may be generated directly on these device features. In this way, potential systematic measurement errors associated with dedicated overlay targets may be avoided.

Referring now to FIGS. 1A-6, systems and methods for scanning scatterometry overlay metrology with a high signal to noise ratio are described in greater detail in accordance with one or more embodiments of the present disclosure.

Figure 1B:
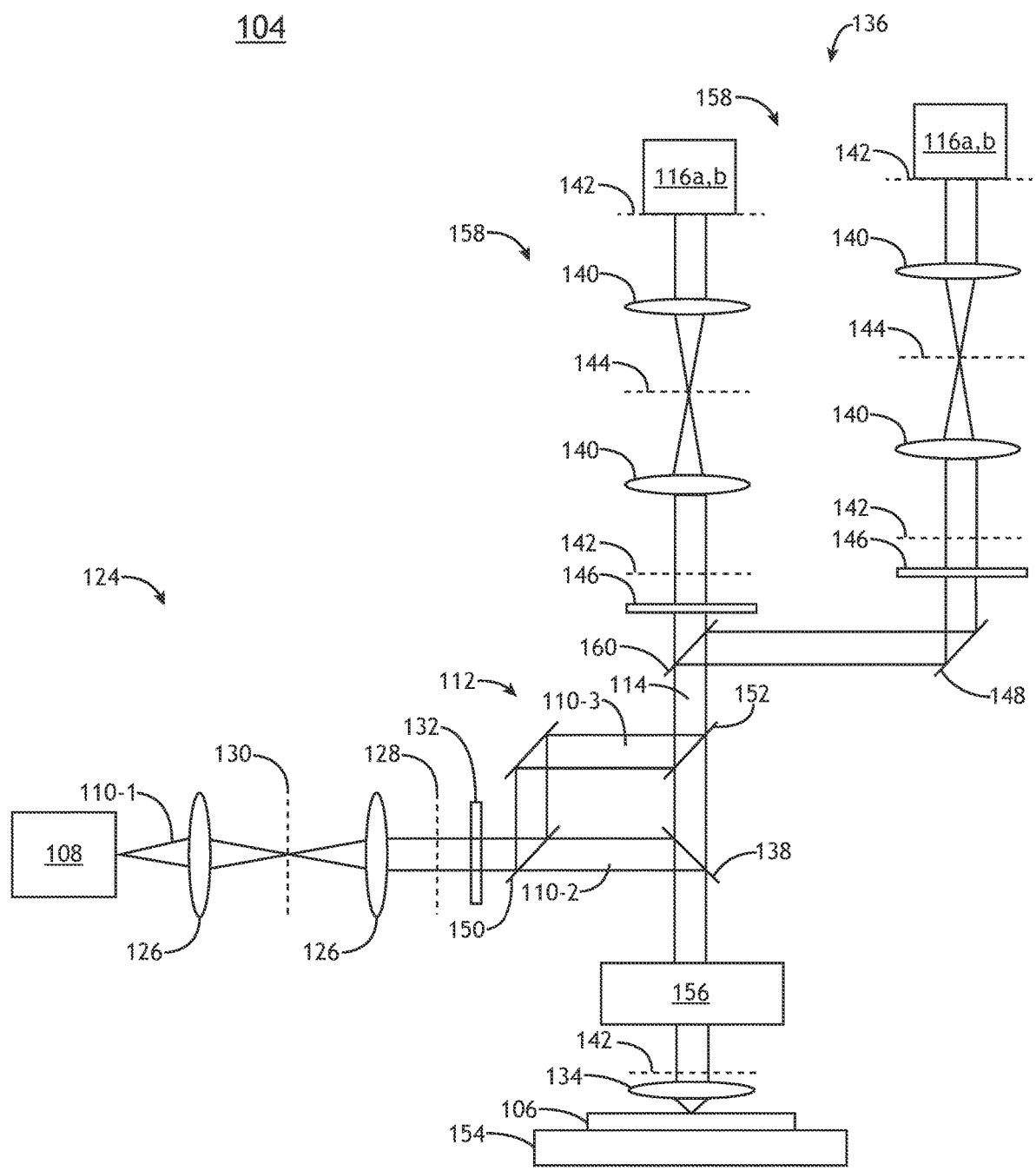
FIG. 1B is a schematic view of the overlay metrology tool, in accordance with one or more embodiments of the present disclosure.

FIG. 1A is a conceptual view of an overlay metrology system 100 for performing scatterometry overlay metrology on an overlay target 102 suitable for overlay measurements along any particular measurement direction, in accordance with one or more embodiments of the present disclosure. In some embodiments, the overlay metrology system 100 includes an optical sub-system 104 to perform scatterometry overlay measurements on overlay targets 102 distributed across a sample 106. FIG. 1B is a schematic view of the optical sub-system 104, in accordance with one or more embodiments of the present disclosure.

For the purposes of the present disclosure, the term overlay is generally used to describe relative positions of features on a sample fabricated by two or more lithographic patterning steps, where the term overlay error describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Further, the term scatterometry metrology is used herein to broadly encompass the terms scatterometry-based metrology and diffraction-based metrology in which a sample having periodic features on one or more sample layers is illuminated with an illumination beam having a limited angular extent and one or more distinct diffraction orders are collected for the measurement. Additionally, the term scanning metrology is used to describe metrology measurements generated when a sample is in motion relative to illumination used for a measurement. In a general sense, scanning metrology may be implemented by moving the sample, the illumination, or both. In this way, specific descriptions herein of a particular technique for implementing scanning metrology are solely illustrative and should not be interpreted as limiting.

In some embodiments, the optical sub-system 104 includes an illumination source 108 to generate illumination 110-1. The illumination source 108 may include any type of illumination source suitable for providing illumination 110-1 suitable for overlay metrology as disclosed herein. In some embodiments, the illumination source 108 is a laser source. For example, the illumination source 108 may include, but is not limited to, one or more narrowband laser sources, a broadband laser source, a supercontinuum laser source, a white light laser source, or the like. In this regard, the illumination source 108 may provide illumination having high coherence (e.g., high spatial coherence and/or temporal coherence). In some embodiments, the illumination source 108 includes a laser-sustained plasma (LSP) source. For example, the illumination source 108 may include, but is not limited to, a LSP lamp, a LSP bulb, or a LSP chamber suitable for containing one or more elements that, when excited by a laser source into a plasma state, may emit broadband illumination.

Further, the illumination 110-1 may include one or more selected wavelengths of light including, but not limited to, ultraviolet (UV) radiation, visible radiation, or infrared (IR) radiation.

The optical sub-system 104 may then include an interferometer 112 to split the illumination 110-1 into two portions referred to herein as primary illumination 110-2 and auxiliary illumination 110-3. In this configuration, the illumination sub-system 124 may direct the primary illumination 110-2 to the overlay target 102 (e.g., in the form of one or more illumination beams) and collect at least a portion of the primary illumination 110-2 emanating from the sample 106 (e.g., one or more diffraction orders of the primary illumination 110-2). The collected light from the sample 106, which may include diffraction orders of the primary illumination 110-2, is referred to herein as measurement light 114. The interferometer 112 may then combine the auxiliary illumination 110-3 with one or more selected diffraction orders of the primary illumination 110-2, which may generate time-varying signals indicative of overlay of the sample 106. The optical sub-system 104 may then include one or more photodetectors 116 to capture the time-varying signals indicative of overlay and a controller 118 with one or more processors 120 and memory 122 (e.g., a memory device). The one or more processors 120 may be configured to execute a set of program instructions maintained in the memory 122. In this way, the controller 118 may implement any of the various process steps described throughout the present disclosure such as, but not limited to, receiving time-varying interference signals from the photodetectors 116, processing or filtering the time-varying interference signals, or generating overlay measurements associated with the sample 106 based on the time-varying interference signals.

Figure 2A:
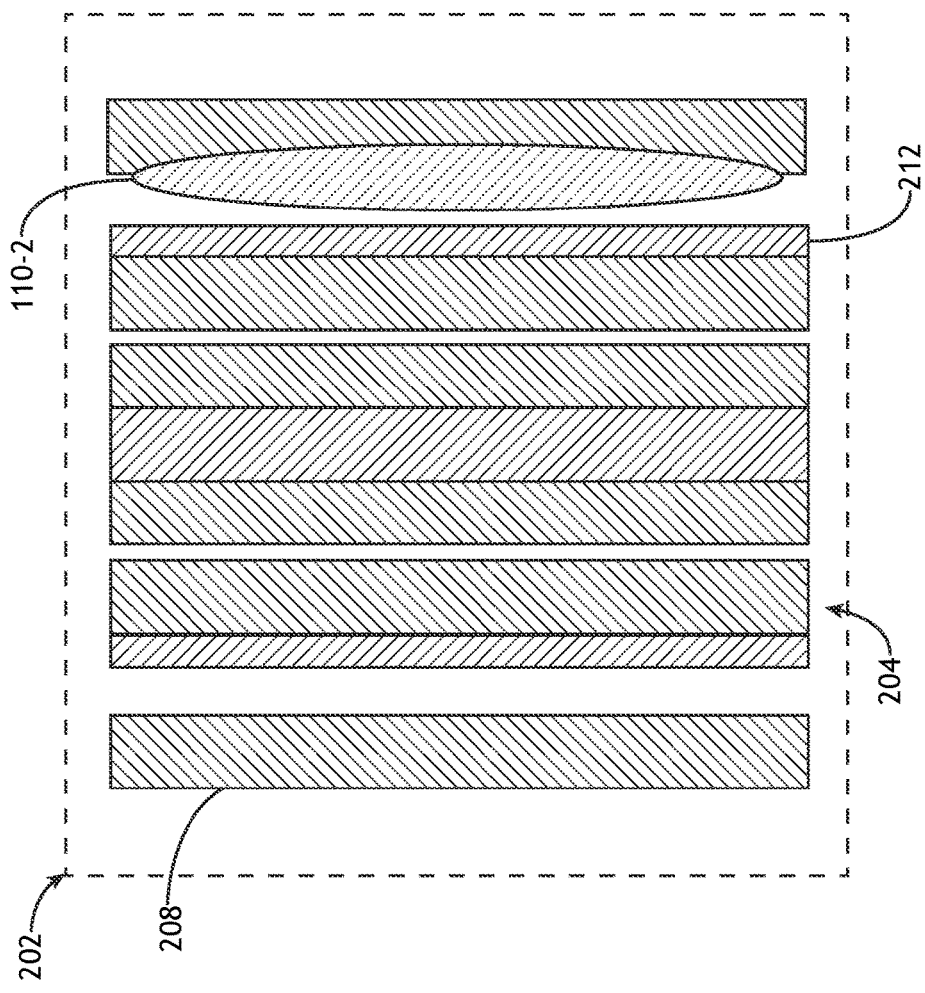
FIG. 2A is a top view of a cell of an overlay target with a Moiré structure, in accordance with one or more embodiments of the present disclosure.
Figure 2B:
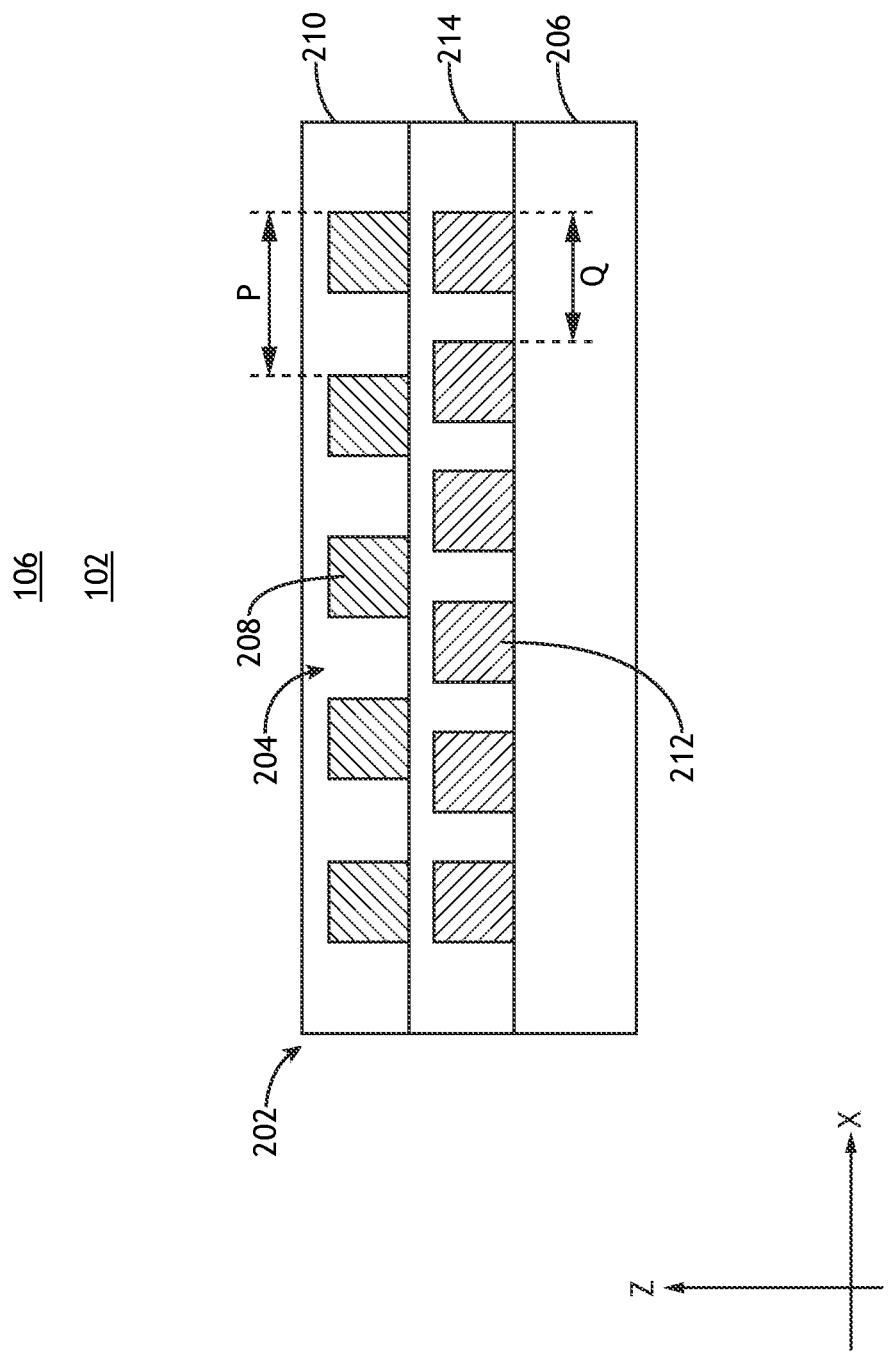
FIG. 2B is a side view of a single cell of the overlay target in FIG. 2A on a substrate, in accordance with one or more embodiments of the present disclosure.
Figure 2C:
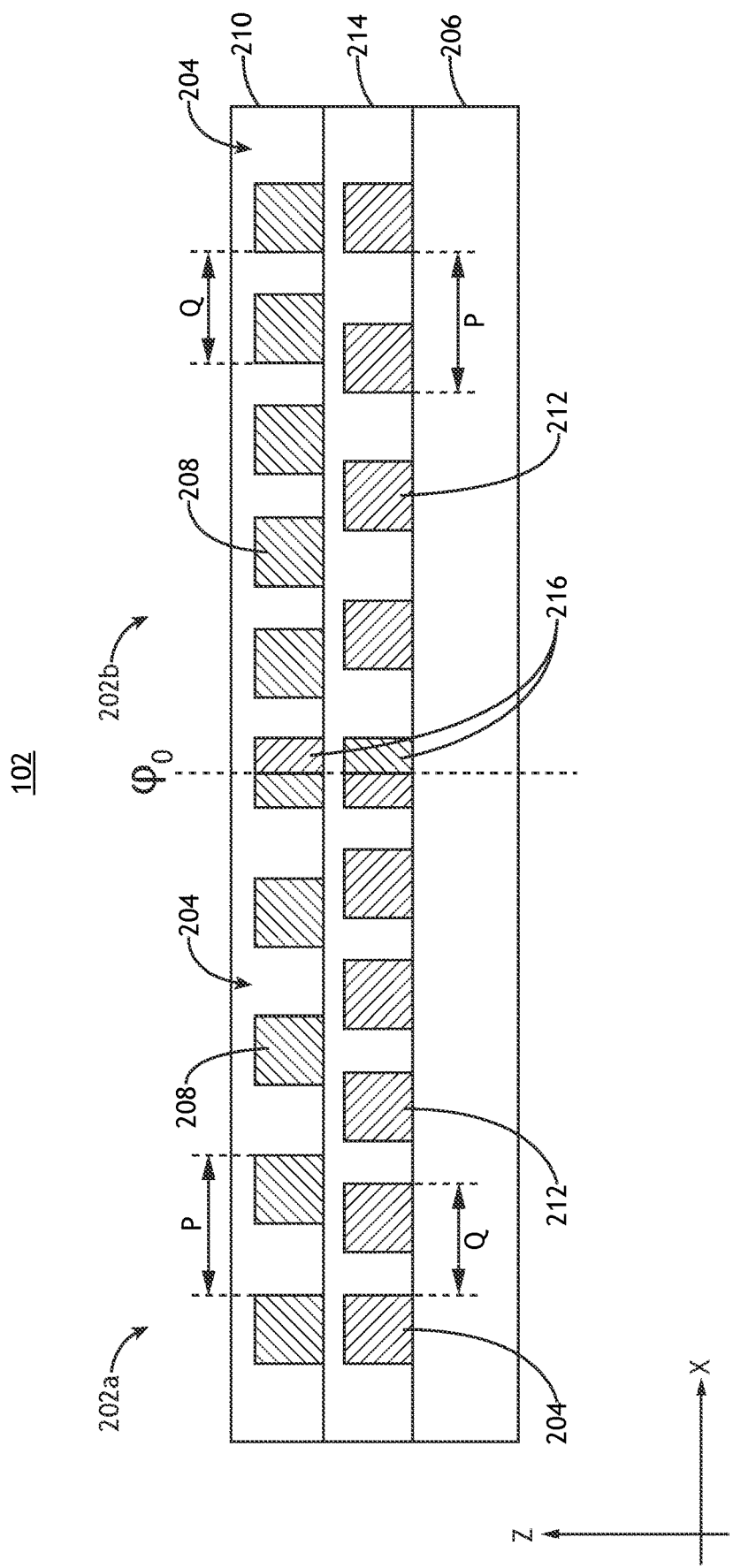
FIG. 2C is a side view of an overlay target including two cells with different configurations of Moiré structures suitable for an overlay measurement along a particular measurement direction, in accordance with one or more embodiments of the present disclosure.

Referring now to FIGS. 2A-2C, various aspects of an overlay target 102 suitable for scanning overlay metrology are described in greater detail, in accordance with one or more embodiments of the present disclosure. In particular, FIGS. 2A-2C illustrate an overlay target 102 including at least one Moiré structure, in accordance with one or more embodiments of the present disclosure. Such an overlay target 102 may be suitable for, but is not limited to, measurements by the optical sub-system 104.

FIG. 2A is a top view of a cell 202 of an overlay target 102 with a Moiré structure 204, in accordance with one or more embodiments of the present disclosure. FIG. 2B is a side view of a single cell 202 of the overlay target 102 in FIG. 2A on a substrate 206, in accordance with one or more embodiments of the present disclosure. In some embodiments, the Moiré structure 204 includes a first-layer grating 208 (e.g., a top grating) located on a first layer 210 of the sample 106 and a second-layer grating 212 (e.g., a bottom grating) located on a second layer 214 of the sample 106 oriented such that the regions including the first-layer grating 208 and the second-layer grating 212 overlap to form a grating-over-grating structure. Further, the first-layer grating 208 and the second-layer grating 212 have different pitches. For example, FIG. 2B illustrates the pitches of the first-layer grating 208 and the second-layer grating 212 as P and Q, respectively.

An overlay target 102 may generally be formed from any number of cells 202 and any particular cell 202 may include a Moiré structure 204 with a periodicity along any direction. Further, in some embodiments, an overlay target 102 includes multiple cells 202 with Moiré structures 204 having periodicity along a common direction, where the different cells 202 have different configurations of the periodicities of the associated gratings.

FIG. 2C is a side view of an overlay target 102 including two cells 202a,b with different configurations of Moiré structures 204 suitable for an overlay measurement along a particular measurement direction (e.g., here, the X direction), in accordance with one or more embodiments of the present disclosure. In particular, FIG. 2C illustrates an inverted Moiré structure pair in which a first cell 202a includes a first-layer grating 208 with a first pitch (P) and a second-layer grating 212 with a second pitch (Q), whereas the second cell 202b includes a first-layer grating 208 with the second pitch (Q) and a second-layer grating 212 with the first pitch (P). It is contemplated herein that such an inverted Moiré structure pair may facilitate the determination of overlay based on time-varying interference signals generated as both cells 202 are scanned with respect to an illumination beam during a measurement.

It is contemplated herein that the different cells 202a,b of an inverted Moiré structure pair may be oriented in various configurations in an overlay target 102. In some embodiments, the cells 202a,b are oriented side-by-side along a direction of periodicity (e.g., the X-direction in FIG. 2C). Further, as illustrated in FIG. 2C, the cells 202 may be arranged to provide a continuous structure such that the phase transition associated with the time-varying interference signals is well-known and may be accounted for. Such an arrangement of an inverted Moiré structure pair may be, but is not required to be, referred to as a vertical overlay target. In particular, FIG. 2C represents a particular non-limiting configuration in which central target features 216 on the first layer 210 and the second layer 214 overlap. In this way, the center of the combined inverted Moiré structure pair may provide a reference point for the phase transition (e.g., $\varphi_0$) as will be described in greater detail below.

It is to be understood, however, that the overlay target 102 in FIGS. 2A-2C and the associated description are provided solely for illustrative purposes and should not be interpreted as limiting. Rather, the overlay target 102 may include any suitable overlay target design. For example, the overlay target 102 may include a grating-over-grating structure in which the first-layer grating 208 and the second-layer grating 212 have the same period (e.g., P). As another example, the overlay target 102 may include any number of cells 202 suitable for measurements along two directions. Further, the cells 202 may be distributed in any pattern or arrangement. For example, metrology target designs suitable for scanning metrology are generally described in U.S. patent application Ser. No. 16/598,146 filed on Oct. 10, 2019, which is incorporated herein by reference in its entirety. In some embodiments, the overlay target 102 includes one or more cell groupings distributed along a scanning direction (e.g., a direction of motion of the sample 106), where cells 202 within each particular cell grouping are oriented to have Moiré structures periodic along a common direction. For instance, a first cell grouping may include one or more cells 202 having periodicities along the X direction and a second cell grouping may include one or more cells 202 having periodicities along the Y direction. In this way, all cells 202 within a particular cell grouping may be imaged at the same time while the sample 106 is scanned through a measurement field of view of the collection sub-system 136. As another example, diagonal targets suitable for metrology measurements in orthogonal directions in a single scan are described generally in U.S. patent application Ser. No. 16/964,734 filed on Jul. 24, 2020, which is incorporated herein by reference in its entirety.

Referring again to FIGS. 1A and 1B, various aspects of the optical sub-system 104 will now be described in greater detail, in accordance with one or more embodiments of the present disclosure.

In some embodiments, the optical sub-system 104 includes an illumination sub-system 124 to manipulate light to be directed to the sample 106 and may include any suitable combination of one or more components (e.g., optical elements, or the like). For example, the illumination sub-system 124 may include one or more components to manipulate the illumination 110-1 prior to the interferometer 112. As another example, the illumination sub-system 124 may include one or more components to manipulate the primary illumination 110-2 and/or direct this primary illumination 110-2 to the sample 106.

Referring to FIG. 1B, in some embodiments, the illumination sub-system 124 may include one or more illumination lenses 126 (e.g., to collimate the primary illumination 110-2, to relay an illumination pupil plane 128 and/or an illumination field plane 130, or the like). In some embodiments, the illumination sub-system 124 includes one or more illumination control optics 132 to shape or otherwise control the primary illumination 110-2. For example, the illumination control optics 132 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the optical sub-system 104 includes an objective lens 134 to focus the primary illumination 110-2 onto the sample 106 (e.g., an overlay target 102 on the sample 106).

The primary illumination 110-2 may be directed to the overlay target 102 in any suitable spatial or angular distribution in accordance with a particular metrology recipe being implemented.

In some embodiments, the illumination sub-system 124 illuminates the overlay target 102 with a single illumination beam of the primary illumination 110-2 during a scan. For example, the overlay target 102 may be designed in accordance with a metrology recipe to include one or more cells distributed along a scan direction, which may be sequentially illuminated with the single illumination beam.

In some embodiments, the illumination sub-system 124 illuminates the overlay target 102 with two or more illumination beams of the primary illumination 110-2 illumination, where the two or more illumination beams may be incident on the same or different portions of the overlay target 102. For example, the illumination sub-system 124 may illuminate different cells of an overlay target 102 with different illumination beams. For instance, simultaneous illumination of multiple cells 202 of an overlay target 102 may facilitate simultaneous measurements along multiple measurement directions and/or measurements of multiple cells 202 needed to complete a single measurement along a particular measurement direction. By way of another example, the illumination sub-system 124 may illuminate a particular cell of an overlay target 102 with illumination beams having different incidence angles, which may be useful for but is not limited to controlling a distribution of diffraction lobes in a collection pupil plane.

The primary illumination 110-2 may be provided as two or more illumination beams using any technique known in the art. In some embodiments, the optical sub-system 104 includes various optical elements (e.g., apertures, beamsplitters, diffracting elements, or the like) to split the illumination 110-1 into two or more beams prior to the interferometer 112. In this way, the primary illumination 110-2 and the auxiliary illumination 110-3 may have the same number of beams. For example, the optical sub-system 104 may include two or more apertures at an illumination pupil plane 128 to define two or more illumination beams based on azimuth and/or altitude incidence angles. As another example, the optical sub-system 104 may include one or more beamsplitters or diffractive elements to split the illumination 110-1 into two or more illumination beams. As another example, the illumination source 108 generates the illumination 110-1 in the form of two or more illumination beams directly. In some embodiments, the optical sub-system 104 includes various optical elements in the paths of the primary illumination 110-2 and/or the auxiliary illumination 110-3 to separately modify the number and/or distribution of associated illumination beams.

Additionally, the primary illumination 110-2 may be angularly limited on the sample 106 such that grating structures in one or more cells of the overlay target 102 may generate discrete diffraction orders. Further, the primary illumination 110-2 may be spatially limited (e.g., as one or more illumination beams or illumination lobes) to illuminate selected portions of the overlay target 102. For instance, primary illumination 110-2 split into two or more illumination beams may each be spatially limited to illuminate a particular cell of an overlay target 102. In some embodiments, the primary illumination 110-2 underfills a particular cell of an overlay target 102.

In some embodiments, the optical sub-system 104 includes a collection sub-system 136 to collect measurement light 114 from the sample 106. For example, the measurement light 114 may include selected diffraction orders of the primary illumination 110-2 by the overlay target 102 as determined by a metrology recipe.

In some embodiments, the illumination sub-system 124 and the collection sub-system 136 may utilize or include the objective lens 134. For example, FIG. 1B illustrates a beamsplitter 138 used to direct an illumination beam to the objective lens 134 for illumination of the sample 106 and also direct measurement light 114 from the objective lens 134 to the photodetectors 116.

The collection sub-system 136 may further include one or more collection optics suitable for modifying and/or conditioning the measurement light 114 from the sample 106. In some embodiments, the collection sub-system 136 includes one or more collection lenses 140 (e.g., to collimate the illumination beam, to relay a collection pupil plane 142 and/or a collection field plane 144, or the like). Further, the collection lenses 140 may include, but are not required to include, the objective lens 134. In some embodiments, the collection sub-system 136 includes one or more collection control optics 146 to shape or otherwise control the measurement light 114. For example, the collection control optics 146 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors 148 (e.g., static mirrors, translatable mirrors, scanning mirrors, or the like).

The interferometer 112 may then combine the auxiliary illumination 110-3 with selected diffraction orders of the primary illumination 110-2 (e.g., selected portions of the measurement light 114) for detection. The primary illumination 110-2 and the auxiliary illumination 110-3 through the interferometer 112 may generally have any optical path lengths provided that coherence is maintained for the generation of time-varying interference signals. In some embodiments, the optical path lengths of the primary illumination 110-2 and the auxiliary illumination 110-3 through the interferometer 112 are designed to be approximately equal.

The interferometer 112 may include any component or combination of components suitable for combining a portion of the primary illumination 110-2 from the sample 106 (e.g., the selected portion of the measurement light 114) with the auxiliary illumination 110-3 to generate interference.

The interferometer 112 may generally include any combination of optical elements suitable for interfering auxiliary illumination 110-3 with selected diffraction orders of the primary illumination 110-2. For example, as illustrated in FIG. 1B, the interferometer 112 may include one or more beamsplitters 150 to split the illumination 110-1 from the illumination source 108 into the primary illumination 110-2 and the auxiliary illumination 110-3. The interferometer 112 may then further include one or more beam combiners 152 (e.g., beamsplitters or other combining elements) to combine the auxiliary illumination 110-3 with selected diffraction lobes of the primary illumination 110-2 by the overlay target 102.

The collection sub-system 136 may further include at least two photodetectors 116a,b positioned in at least one collection pupil plane 142 at locations associated with time-varying interference signals indicative of overlay (e.g., locations in the collection pupil plane 142 corresponding to overlap between auxiliary illumination 110-3 and selected diffraction orders of the primary illumination 110-2 by the overlay target 102). For example, as will be described in greater detail below, suitable locations for the photodetectors 116 may include, but are not limited to, locations of the collection pupil plane 142 including selected diffraction orders of the primary illumination 110-2 by the overlay target 102.

The photodetectors 116 (e.g., photodetectors 116a,b) may generally include any type of optical detector known in the art suitable for capturing interference signals generated as the sample 106 is translated by the translation stage 154 and/or as one or more illumination beams are scanned by the beam-scanning sub-system 156. In some embodiments, the photodetectors 116a,b include single-pixel photodiodes such as, but not limited to, photodiodes (e.g., fast photodiodes), photomultipliers, or avalanche photodiodes (APDs). Such single-pixel photodetectors 116 may be individually placed at selected locations in a collection pupil plane 142 such as locations associated with diffraction orders from features the overlay target 102 (e.g., measurement light 114) in accordance with a selected metrology recipe. In some embodiments, the photodetectors 116a,b are part of a multi-pixel sensor such as, but not limited to, a line sensor, a complementary metal-oxide-semiconductor (CMOS) sensor or a charge-coupled device (CCD). In this way, the photodetectors 116a,b may correspond to pixels or groups of pixels of such a multi-pixel sensor.

In a general sense, the bandwidth or response time of the photodetectors 116 should be sufficient to resolve the temporal frequency of the interference fringes, which is related to the pitches of the constituent grating structures and the scanning speed along a scan. For example, in the case of a scan speed of 10 centimeters per second and a target pitch of 1 micrometer, the interference signals will oscillate at a rate on the order of 100 KHz. In some embodiments, the photodetectors 116 include photodetectors having a bandwidth of at least 1 GHz. However, it is to be understood that this value is not a requirement. Rather, the bandwidth of the photodetectors 116, the translation speed along the measurement direction, and the pitch of the Moiré structures may be selected together to provide a desired sampling rate of the interference signal.

In some embodiments, the optical sub-system 104 includes a translation stage 154 to scan the sample 106 through a measurement field of view of the optical sub-system 104 during a measurement to implement scanning metrology.

In some embodiments, the optical sub-system 104 includes a beam-scanning sub-system 156 configured to modify or otherwise control a position of the primary illumination 110-2 (e.g., in the form of at least one illumination beam) on the sample 106. For example, the beam-scanning sub-system 156 may scan the primary illumination 110-2 in a direction orthogonal to a scan direction (e.g., a direction in which the translation stage 154 scans the sample 106) during a measurement. In this way, a scanning measurement may be performed by any relative motion of the sample 106 and the primary illumination 110-2.

The translation stage 154 and/or the beam-scanning sub-system 156 may be synchronized to the photodetectors 116 during a scan using any suitable technique such that signals generated by the photodetectors 116 may be correlated to the position of the primary illumination 110-2 on the overlay target 102 and/or the relative speed of the overlay target 102 with respect to the primary illumination 110-2 during a scan. Such information may facilitate correlation of signals generated by the photodetectors 116 to features of the overlay target 102 for the determination of overlay measurements.

In some embodiments, the optical sub-system 104 includes a phase modulator (not shown) to modulate a phase of the auxiliary illumination 110-3. In this way, both the primary illumination 110-2 and the sample 106 may be stationary during a scan.

The optical sub-system 104 may include one or more collection channels 158. For example, FIG. 1B illustrates a configuration of the optical sub-system 104 with two collection channels 158. It is contemplated herein that the photodetectors 116 may be distributed in any desired distribution between one or more collection channels 158. In some embodiments, multiple photodetectors 116 are located in at least one collection channel 158. In this configuration, multiple collection channels 158 may facilitate simultaneous measurements of different cells (e.g., associated with different measurement directions, different cells required for a particular measurement based on a particular metrology recipe, or the like). In some embodiments, each collection channel 158 includes a single photodetector 116 (e.g., photodetector 116a or photodetector 116b). In this way, each photodetector 116 may be placed at any location in the collection pupil plane 142 regardless of its physical size or any associated components.

The optical sub-system 104 may include one or more channel beamsplitters 160 arranged to split light in the collection sub-system 136 into the different collection channels 158. In some embodiments, as illustrated in FIG. 1B, the channel beamsplitters 160 are located after the interferometer 112. In this way, the light in the collection channels 158 includes time-varying interference patterns indicative of overlay as described herein.

A channel beamsplitter 160 may include any component suitable for splitting light using any technique and may include, but is not limited to, a polarizing beamsplitter or a dichroic beamsplitter (e.g., a dichroic mirror). In some embodiments, a channel beamsplitter 160 splits light into the different collection channels 158 based on a property of the light such as, but not limited to, polarization or wavelength. In this way, the channel beamsplitter 160 may separate light from different beams of the primary illumination 110-2 and/or from different cells 202 of the overlay target 102 into different collection channels 158. As an illustration, the optical sub-system 104 may direct different beams of primary illumination 110-2 to different cells 202 of an overlay target 102, where the different beams of primary illumination 110-2 have different properties (e.g., polarization, wavelength, or the like). One or more channel beamsplitters 160 may then separate the measurement light 114 associated with the different beams of primary illumination 110-2 and/or different cells 202 of an overlay target 102 into different collection channels 158 to provide simultaneous measurements.

Referring now to FIGS. 3A-5, various configurations for overlapping the auxiliary illumination 110-3 with selected diffraction lobes of the primary illumination 110-2 are described in greater detail in accordance with one or more embodiments of the present disclosure. In particular, FIGS. 3A-5 provide non-limiting illustrations for the particular case of overlay measurements on an overlay target 102 depicted in FIGS. 2A-2C including at least one Moiré structure formed from gratings in a particular cell having different pitches (e.g., pitches P and Q). Scanning-based scatterometry overlay metrology based on Moiré structures are generally described in U.S. patent application Ser. No. 17/708,958 filed on Mar. 30, 2022, which is incorporated herein by reference in its entirety. However, it is to be understood that FIGS. 3A-5 are provided solely for illustrative purposes and should not be interpreted as limiting. Rather, the systems and methods disclosed herein may be extended for use with any suitable design of an overlay target 102. Put another way, the systems and methods disclosed herein may be extended to provide an overlap between auxiliary illumination 110-3 and any selected diffraction lobes from any selected overlay target 102 target design suitable for overlay metrology based on any selected metrology recipe. For example, the systems and methods disclosed herein may be extended to, but are not limited to, overlay targets 102 and/or associated metrology recipes described in U.S. Pat. No. 11,300,405 issued on Apr. 12, 2022, U.S. Pat. No. 11,378,394 issued on Jul. 5, 2022, and U.S. patent application Ser. No. 17/709,104 filed on Mar. 30, 2022, all of which are incorporated herein by reference in their entireties.

Figure 3A:
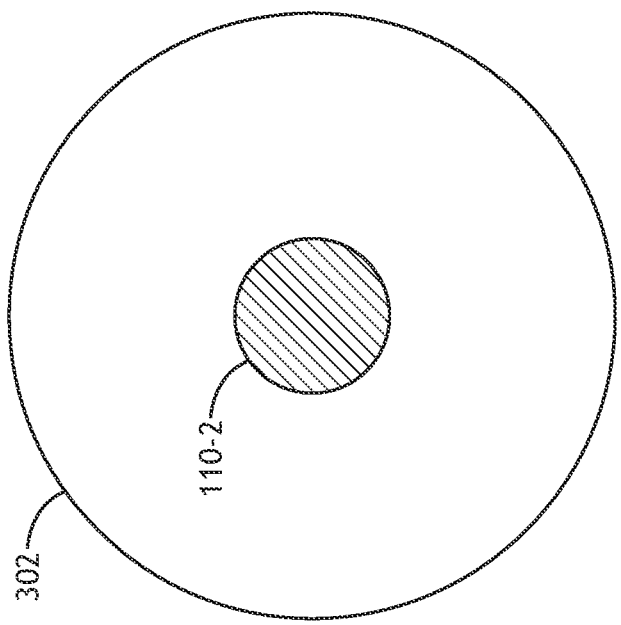
FIG. 3A is a top view of an illumination pupil plane of the overlay metrology tool, in accordance with one or more embodiments of the present disclosure.
Figure 3B:
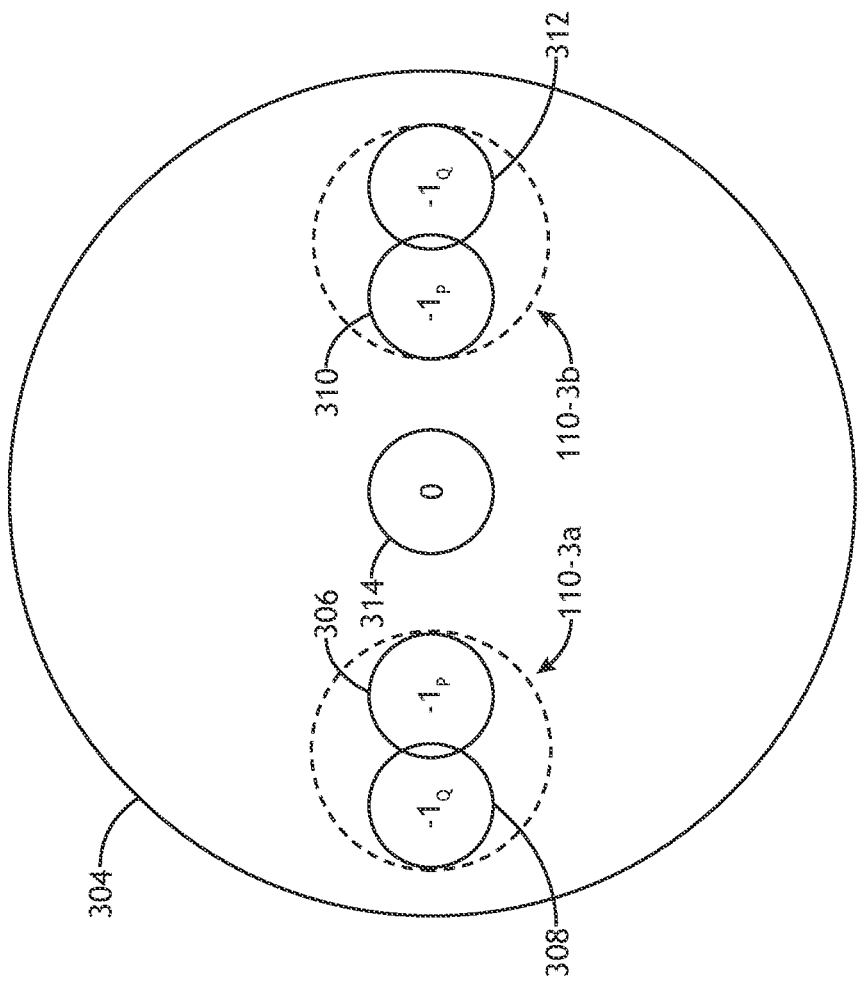
FIG. 3B is a top view of a collection pupil boundary in the collection pupil plane of the overlay metrology tool illustrating an overlap between auxiliary illumination and +/−1 order diffraction lobes of primary illumination by the Moiré structure of FIGS. 2A-2C, in accordance with one or more embodiments of the present disclosure.
Figure 4:
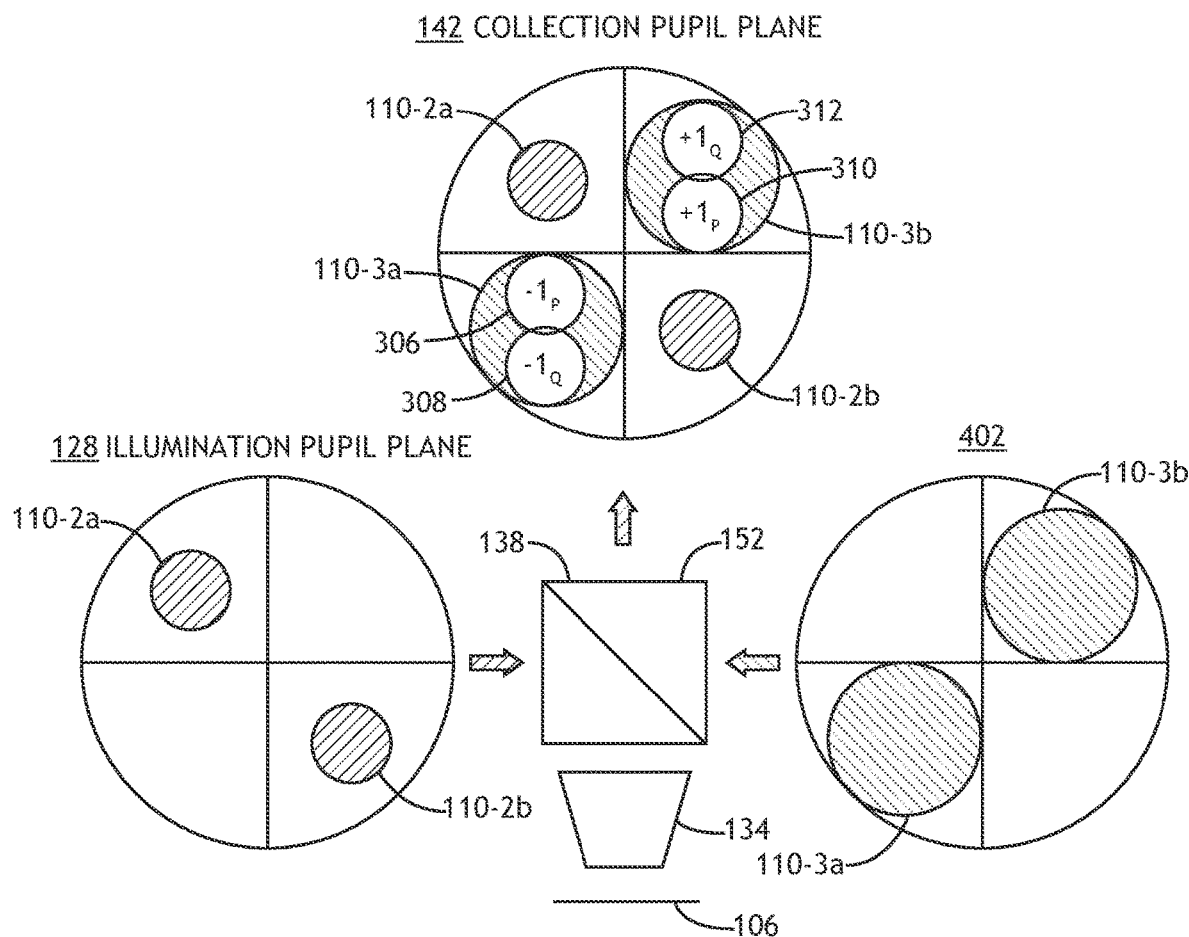
FIG. 4 is a conceptual view of the overlay metrology tool providing oblique primary illumination and associated auxiliary illumination, in accordance with one or more embodiments of the present disclosure.
Figure 5:
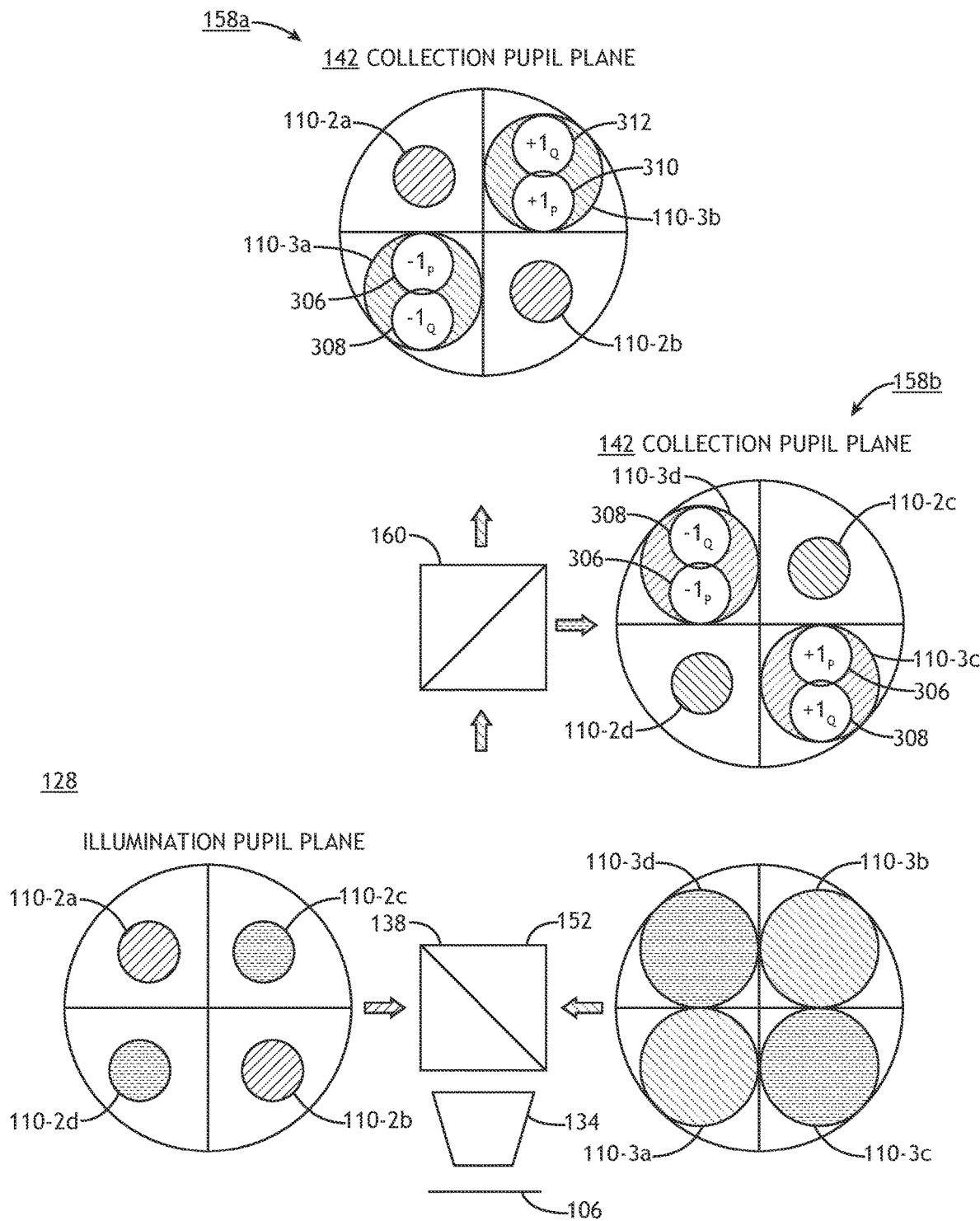
FIG. 5 is a conceptual view of the overlay metrology tool providing simultaneous characterization the overlay target with multiple illumination conditions, in accordance with one or more embodiments of the present disclosure.

FIGS. 3A and 3B illustrate a first non-limiting example of illumination and collection pupil distributions for scanning overlay metrology based on normal-incidence primary illumination 110-2, in accordance with one or more embodiments of the present disclosure. FIG. 4 illustrates a second non-limiting example of illumination and collection pupil distributions for scanning overlay metrology based on oblique-incidence primary illumination 110-2, in accordance with one or more embodiments of the present disclosure. FIG. 5 illustrates a third non-limiting example of illumination and collection pupil distributions for scanning overlay metrology based on oblique-incidence primary illumination 110-2, in accordance with one or more embodiments of the present disclosure.

FIG. 3A is a top view of an illumination pupil plane 128 of the optical sub-system 104 (e.g., as shown in FIG. 1B), in accordance with one or more embodiments of the present disclosure. In some embodiments, the illumination sub-system 124 illuminates the overlay target 102 with one or more illumination beams of the primary illumination 110-2 at normal incidence (or near-normal incidence) as illustrated in FIG. 3A. For example, FIG. 3A illustrates a single illumination beam of the primary illumination 110-2 in a center of a pupil boundary 302 of the illumination pupil plane 128. Further, the one or more illumination beams may illuminate the overlay target 102 with a limited range of incidence angles as illustrated by the limited size in the collection pupil plane 142. In this regard, the overlay target 102 may diffract the primary illumination 110-2 into discrete diffraction orders.

It is recognized herein that the distribution of diffracted orders of an illumination beam by a periodic structure in an overlay target 102 may be influenced by a variety of parameters such as, but not limited to, a wavelength of the illumination beam, an incidence angle of the illumination beam in both altitude and azimuth directions, pitches of the gratings of an overlay target 102, or a numerical aperture (NA) of a collection lens. Accordingly, in embodiments of the present disclosure, the illumination sub-system 124, the collection sub-system 136, and the overlay target 102 may be configured to provide a desired distribution of diffraction orders in a collection pupil suitable for generating time-varying interference patterns indicative of overlay. For example, the illumination sub-system 124 and/or the collection sub-system 136 may be configured (e.g., using a measurement recipe) to generate measurements on overlay targets 102 having grating features with a selected range of pitches to provide a desired collection pupil distribution. Further, various components of the illumination sub-system 124 and/or the collection sub-system 136 (e.g., stops, pupils, or the like) may be adjustable (e.g., using a measurement recipe) to provide the desired collection pupil distribution.

Further, the sizes and shapes of diffraction orders in the collection pupil plane 142 may generally be related to the size and shape of an illumination beam on the sample 106. For example, although not shown, in the case that the illumination beam is elongated, the associated diffraction orders may similarly be elongated.

Referring now to FIG. 3B, tailored overlap between auxiliary illumination 110-3 and selected diffraction lobes to promote a high signal to noise ratio is described in greater detail, in accordance with one or more embodiments of the present disclosure.

It is contemplated herein that the signal to noise ratio of the time-varying interference signals and thus a sensitivity of an overlay measurement based on these signals may be impacted by various factors such as, but not limited to, the strength and contrast of the time-varying interference signals generated by the photodetectors 116. For example, it may generally be desirable to increase an overlap area between diffraction lobes of interest to increase the overall number of photons contributing to the time-varying interference signals. It may also be generally desirable to limit the collection of light from other portions of the collection pupil plane 142 (e.g., outside of an overlap area of interest) to limit a constant (DC) bias signal captured by a photodetector 116 along with the time-varying interference signal of interest. It may further be generally desirable to match the relative intensities of the diffraction orders to promote a high contrast interference pattern such that the interference fringes have high visibility.

It is further contemplated herein that the use of the interferometer 112 to split the illumination 110-1 from the illumination source 108 into primary illumination 110-2 incident on the overlay target 102 and separate auxiliary illumination 110-3 enables tailoring of various conditions to promote a high signal to noise ratio.

For example, an amount of overlap between diffraction lobes of the primary illumination 110-2 by the overlay target 102 (and thus a number of photons contributing to a time-varying interference signal) may be limited by parameters such as, but not limited to, the wavelength of the primary illumination 110-2, the pitches of gratings in the overlay target 102, and a beam shape of the incident primary illumination 110-2 and thus the resulting diffraction orders. In some cases, it may be impractical or impossible to directly provide a distribution of diffraction lobes with a reasonable overlap area to provide a suitable signal to noise ratio. However, the use of separate but coherent auxiliary illumination 110-3 removes or relaxes the requirements for directly generating overlapping diffraction lobes since the auxiliary illumination 110-3 may be flexibly positioned as desired in the collection pupil plane 142. More generally, various parameters of the auxiliary illumination 110-3 may be tailored (e.g., using collection control optics 146, or the like) such as, but not limited to, a number of lobes, lobe size, lobe shape, lobe intensity, lobe polarization, or lobe position in the collection pupil plane 142.

As an illustration, FIG. 3B is a top view of a collection pupil boundary 304 in the collection pupil plane 142 of the optical sub-system 104 illustrating an overlap between auxiliary illumination 110-3 and +/−1 order diffraction lobes of primary illumination 110-2 by the Moiré structure 204 of FIGS. 2A-2B, in accordance with one or more embodiments of the present disclosure. In particular, FIG. 3B illustrates a first lobe of auxiliary illumination 110-3a overlapped with a −1 order diffraction lobe 306 from the first-layer grating 208 (−1$_P$) and a −1 order diffraction lobe 308 from the second-layer grating 212 (−1$_Q$), along with a second lobe of auxiliary illumination 110-3b overlapped with a +1 order diffraction lobe 310 from the first-layer grating 208 (+1$_P$) and a +1 order diffraction lobe 312 from the second-layer grating 212 (+1$_Q$). FIG. 3B further illustrates a reflected 0-order diffraction lobe 314 of the primary illumination 110-2.

It is contemplated herein that the particular arrangement of the number or shape of lobes of the auxiliary illumination 110-3 and/or the number or shape of the diffraction lobes associated with diffraction of the primary illumination 110-2 depicted in FIG. 3B is merely illustrative and should not be interpreted as limiting. Rather, any arrangement of such lobes providing time-varying signals is within the spirit and scope of the present disclosure. As an illustration, the −1 order diffraction lobe 306 need not necessarily overlap with the −1 order diffraction lobe 308 and the +1 order diffraction lobe 310 need not necessarily overlap with the +1 order diffraction lobe 312. Rather, time-varying interference signals (perhaps having different frequencies) may be generated based on overlap of these lobes with the auxiliary illumination 110-3. Further, the auxiliary illumination 110-3 may be distributed into any number of lobes with any shape. For example, although not illustrated in FIG. 3B, the auxiliary illumination 110-3 may be split into four lobes that are separately arranged to overlap with the −1 order diffraction lobe 306, the −1 order diffraction lobe 308, the +1 order diffraction lobe 310, and the +1 order diffraction lobe 312.

It is further contemplated herein that time-varying signals indicative of overlay may be generated by various configurations of one or more photodetectors 116 in the collection pupil plane 142. In some embodiments, a first photodetector 116 (not shown) may capture a portion of the pupil plane including overlap between the first lobe of auxiliary illumination 110-3a with the −1 order diffraction lobe 306 from the from the first-layer grating 208 (−1$_P$) as well as with the −1 order diffraction lobe 308 from the second-layer grating 212 (−1$_Q$). Similarly, a second photodetector 116 (not shown) may capture a portion of the pupil plane including an overlap between the second lobe of auxiliary illumination 110-3b, the +1 order diffraction lobe 310 from the from the first-layer grating 208 (+1$_P$) as well as with the +1 order diffraction lobe 312 from the second-layer grating 212 (+1$_Q$). In some embodiments, a first photodetector 116 (not shown) may capture overlap between the first lobe of auxiliary illumination 110-3a with the −1 order diffraction lobe 306 from the from the first-layer grating 208 (−1$_P$), a second photodetector 116 (not shown) may capture overlap between the first lobe of auxiliary illumination 110-3a with the −1 order diffraction lobe 308 from the second-layer grating 212 (−1$_Q$), a third photodetector 116 (not shown) may capture overlap between the second lobe of auxiliary illumination 110-3b and the +1 order diffraction lobe 310 from the from the first-layer grating 208 (+1$_P$), and a fourth photodetector 116 (not shown) may capture overlap between the second lobe of auxiliary illumination 110-3b and the +1 order diffraction lobe 312 from the second-layer grating 212 (+1$_Q$).

Thus, in a general sense, any number of photodetectors 116 may be used to capture time-varying interference signals associated with overlap between various diffraction lobes. Further, as described previously herein, the photodetectors 116 may be formed as single-pixel detectors or may correspond to pixels of a detector array and/or a multi-pixel sensor.

Various aspects of the configuration illustrated in FIG. 3B may contribute to a high signal to noise ratio. For the non-limiting cell 202 in FIGS. 2A-2B, time-varying interference signals may be generated through overlap of diffraction lobes associated with both the first-layer grating 208 and the second-layer grating 212 either with each other or another reference such as 0-order diffraction. In the absence of the separate auxiliary illumination 110-3 provided in the systems and methods disclosed herein, time-varying interference signals may be generated at locations of overlap between +/−1 diffraction lobes of these constituent gratings (e.g., overlap between the +1 order diffraction lobe 310 and +1 order diffraction lobe 312, overlap between −1 order diffraction lobe 306 and −1 order diffraction lobe 308, or the like), at Moiré diffraction lobes (e.g., associated with double diffraction from both the first-layer grating 208 and the second-layer grating 212), or at overlap areas between the Moiré diffraction lobes and the 0-order diffraction lobe 314. However, the amount of overlap between the diffraction lobes in each of these configurations depends on the differences between the pitches of these gratings as well as the beam shape of the incident illumination.

In contrast, FIG. 3B illustrates a configuration in which auxiliary illumination 110-3 overlaps with the +/−1 diffraction lobes as described above. In this configuration, as illustrated in FIG. 3B, there is no requirement that the +/−1 diffraction lobes from the first-layer grating 208 and the second-layer grating 212 overlap with each other or the 0-order diffraction lobe 314. Rather, the lobes of the auxiliary illumination 110-3a,b may be arranged and sized to overlap with diffraction lobes from the first-layer grating 208 and the second-layer grating 212. In particular, FIG. 3B illustrates a configuration in which there exists minimal overlap between diffraction lobes from the first-layer grating 208 and the second-layer grating 212 (e.g., minimal overlap between the +1 order diffraction lobe 310 and the +1 order diffraction lobe 312, and so on) and no overlap with the reflected 0-order diffraction lobe 314. As a result, the shape of the primary illumination 110-2, the wavelength of the primary illumination 110-2, and the pitches of the first-layer grating 208 and the second-layer grating 212 may all be flexibly selected. The size, location, shape, and intensity of the lobes of the auxiliary illumination 110-3 may then be selected to provide time-varying interference fringes with a high signal to noise ratio.

Referring now to FIG. 4, FIG. 4 is a conceptual view of the optical sub-system 104 providing oblique primary illumination 110-2 and associated auxiliary illumination 110-3, in accordance with one or more embodiments of the present disclosure.

FIG. 4 conceptually illustrates a rotated dipole distribution of illumination beams of the primary illumination 110-2 (110-2a, 110-2b) in an illumination pupil plane 128 directed to the overlay target 102 through the beamsplitter 138 and the objective lens 134. FIG. 4 further illustrates a collection pupil plane 142 including diffraction lobes of primary illumination 110-2 along the overlay target 102 of FIGS. 2A-2B but oriented with a direction of periodicity along the Y direction. In particular, FIG. 4 illustrates a −1 order diffraction lobe 306 and a −1 order diffraction lobe 308 from a first illumination lobe 110-2a, along with a +1 order diffraction lobe 310 and a +1 order diffraction lobe 312 from a second illumination lobe 110-2b. Finally, FIG. 4 illustrates a dipole distribution 402 of the auxiliary illumination 110-3 that is rotated with respect to the primary illumination 110-2 such that the lobes of the auxiliary illumination 110-3a,b overlap with the first-order diffraction from the first-layer grating 208 and the second-layer grating 212. In this way, FIG. 4 may provide a similar measurement as depicted in FIG. 3B. However, the use of oblique illumination may allow for overlay targets 102 with smaller pitches and potentially smaller overall sizes.

It is noted that FIG. 4 illustrates the operation of the beamsplitter 138 both to facilitate illumination and collection with the objective lens 134 and as the beam combiner 152 of the interferometer 112 to combine the auxiliary illumination 110-3 with the diffraction lobes of the primary illumination 110-2. However, it is to be understood that this is merely an illustration and separate components may be used.

Referring now to FIG. 5, FIG. 5 is a conceptual view of the optical sub-system 104 providing simultaneous characterization the overlay target 102 with multiple illumination conditions, in accordance with one or more embodiments of the present disclosure.

In some embodiments, the optical sub-system 104 provides illumination 110-1 with two different illumination conditions having different properties such as, but not limited to, wavelength or polarization. In this way, the optical sub-system 104 may provide two distributions of primary illumination 110-2 and associated auxiliary illumination 110-3 for different measurements in different collection channels 158.

For example, FIG. 5 illustrates an illumination pupil plane 128 including a first rotated dipole distribution of illumination beams of the primary illumination 110-2 (110-2$a$, 110-2$b$) (e.g., as illustrated in FIG. 4) and a second rotated dipole distribution of illumination beams of the primary illumination 110-2 (110-2$c$, 110-2$d$) in opposite quadrants of the illumination pupil plane 128. FIG. 5 further illustrates a corresponding rotated dipole distribution of auxiliary illumination 110-3 including lobes (110-3$a$, 110-3$b$) and a second rotated dipole distribution of auxiliary illumination 110-3 including lobes (110-3$c$, 110-3$d$).

FIG. 5 additionally illustrates a channel beamsplitter 160 to separate the diffraction lobes of the primary illumination 110-2 and corresponding auxiliary illumination 110-3 with the different illumination distributions into different collection channels 158. For example, the channel beamsplitter 160 may include a dichroic beamsplitter, a polarizing beamsplitter, or any other component suitable for separating the primary illumination 110-2 and auxiliary illumination 110-3 with different illumination conditions.

As an illustration, FIG. 5 depicts a first collection channel 158$a$ that may include the lobes of auxiliary illumination 110-3$a,b$ overlapping with selected diffraction lobes of the primary illumination 110-2$a,b$, while a second collection channel 158$b$ may include the lobes of auxiliary illumination 110-3$c,d$ overlapping with selected diffraction lobes of the primary illumination 110-2$c,d$.

It is contemplated herein that the techniques illustrated in FIG. 5 may be applicable to a wide variety of simultaneous measurement schemes. For example, as illustrated in FIG. 5, the two illumination conditions may provide simultaneous measurements of the same cell 202 of an overlay target 102 with the different conditions. By way of another example, the lobes of the primary illumination 110-2 with different illumination conditions may be directed to different cells 202 of an overlay target 102 to provide simultaneous measurements of the different cells 202. Further, the different cells 202 may include grating structures with the same or different directions of periodicity. In this way, any of the systems and methods disclosed herein may be extended to, but is not limited to, any of the multi-cell illumination measurement techniques depicted in U.S. Pat. No. 11,300,405 issued on Apr. 12, 2022 and U.S. patent application Ser. No. 17/708,958 filed on Mar. 30, 2022, which are both incorporated herein by reference in their entireties.

Referring again to FIGS. 1A and 1B, additional details of the optical sub-system 104 are described in greater detail, in accordance with one or more embodiments of the present disclosure.

The one or more processors 120 of the controller 118 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 120 may include any device configured to execute algorithms and/or instructions (e.g., program instructions stored in memory). In some embodiments, the one or more processors 120 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 118 may include one or more controllers housed in a common housing or within multiple housings. In this way, any controller or combination of controllers may be separately packaged as a module suitable for integration into metrology overlay metrology system 100. Further, the controller 118 may analyze or otherwise process data received from the photodetectors 116 and feed the data to additional components within the overlay metrology system 100 or external to the overlay metrology system 100.

Further, the memory 122 may include any storage medium known in the art suitable for storing program instructions executable by the associated one or more processors 120. For example, the memory 122 may include a non-transitory memory medium. As an additional example, the memory 122 may include, but is not limited to, a read-only memory, a random-access memory, a magnetic or optical memory device (e.g., disk), a magnetic tape, a solid-state drive, or the like. It is further noted that memory 122 may be housed in a common controller housing with the one or more processors 120.

In this regard, the controller 118 may execute any of various processing steps associated with overlay metrology. For example, the controller 118 may be configured to generate control signals to direct or otherwise control the optical sub-system 104, or any components thereof. For instance, the controller 118 may be configured to direct the translation stage 154 to translate the sample 106 along one or more measurement paths, or swaths, to scan one or more overlay targets through a measurement field of view of the optical sub-system 104 and/or direct the beam-scanning sub-system 156 to position or scan one or more illumination beams on the sample 106. By way of another example, the controller 118 may be configured to receive signals corresponding to the time-varying interference signals from the photodetectors 116. By way of another example, the controller 118 may generate correctables for one or more additional fabrication tools as feedback and/or feed-forward control of the one or more additional fabrication tools based on overlay measurements from the optical sub-system 104.

In some embodiments, the controller 118 captures the interference signals detected by the photodetectors 116. The controller 118 may generally capture data such as, but not limited to, the magnitudes or the phases of the time-varying interference signals (e.g., intensity and/or phase information) using any technique known in the art. For example, the controller 118 may capture data such as, but not limited to, the magnitudes or the phases of the time-varying interference signals (e.g., intensity and/or phase information) using phase-locking techniques (e.g., phase-locked loops). For example, the controller 118 may capture data such as, but not limited to, the magnitudes or the phases of the time-varying interference signals (e.g., intensity and/or phase information) using Fourier analysis techniques (or any other suitable spectral decomposition techniques). In a general sense, the controller 118 may capture the interference signals, or any data associated with the interference signals, using any combination of hardware (e.g., circuitry) or software techniques.

In some embodiments, the controller 118 determines an overlay measurement between layers of the overlay target 102 along the measurement direction based on the comparison of the interference signals. For example, the controller 118 may compare the magnitudes and/or phases of the interference signals to generate an overlay measurement. For instance, the electric field of diffracted orders in a collection pupil and further provides specific relationships between overlay and measured intensity in the pupil plane are generally described in U.S. Pat. No. 10,824,079 issued on Nov. 3, 2020, which is incorporated herein by reference in its entirety. It is contemplated herein that the systems and methods disclosed herein may extend the teachings of U.S. Pat. No. 10,824,079 to time-varying interference signals captured by photodetectors 116 placed in overlap regions as disclosed herein. In particular, it is contemplated herein that overlay on a sample 106 may be proportional to asymmetries such as, but not limited to, a relative phase shift between the two time-varying interference signals. In another instance, the relative intensities of the diffraction orders in the pupil plane may be extracted from the time-varying interference signals. In this way, any overlay algorithm based on relative intensity differences of diffraction orders known in the art may be applied to generate an overlay measurement.

Further, the controller 118 may calibrate or otherwise modify the overlay measurement based on known, assumed, or measured features of the sample that may also impact the time-varying interference signals such as, but not limited to, sidewall angles or other sample asymmetries.

In some embodiments, the optical sub-system 104 includes a beam-scanning sub-system 156 to position, scan, or modulate positions of one or more illumination beams on the sample 106 during measurement. Further, the beam-scanning sub-system 156 and the photodetectors 116 may be synchronized to facilitate a link between the scanning speed and the pitch of the features of the overlay target 102.

The beam-scanning sub-system 156 may include any type or combination of elements suitable for scanning positions of one or more illumination beams. In some embodiments, the beam-scanning sub-system 156 includes one or more deflectors suitable for modifying a direction of an illumination beam. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electro-mechanical system (MEMS) device. By way of another example, the beam-scanning sub-system 156 may include an electro-optic modulator, an acousto-optic modulator, or the like.

The deflectors may further be positioned at any suitable location in the optical sub-system 104. In some embodiments, one or more deflectors are placed at one or more pupil planes common to both the illumination sub-system 124 and the collection sub-system 136. In this regard, the beam-scanning sub-system 156 may be a pupil-plane beam scanner and the associated deflectors may modify the positions of one or more illumination beams on the sample 106 without impacting positions of diffraction orders in the collection pupil plane 142. Further, a distribution of one or more illumination beams in an illumination field plane 130 may further be stable as the beam-scanning sub-system 156 modifies positions of the one or more illumination beams on the sample 106. Pupil-plane beam scanning is described generally in U.S. Pat. No. 11,300,524 issued on Apr. 12, 2022, which is incorporated herein by reference in its entirety.

Figure 6:
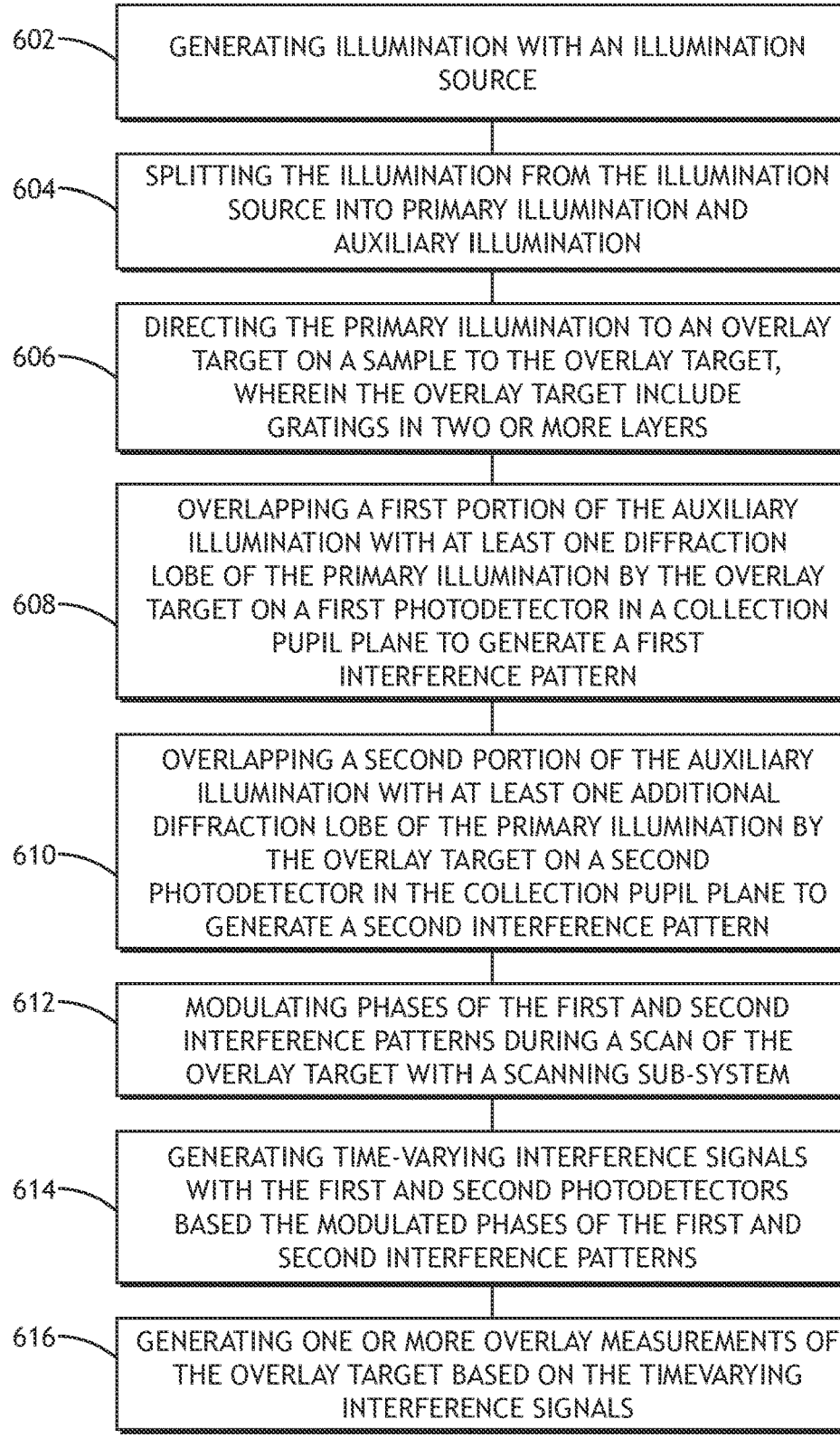
FIG. 6 is a flow diagram illustrating steps performed in an overlay metrology method, in accordance with one or more embodiments of the present disclosure.

Referring now to FIG. 6, FIG. 6 is a flow diagram illustrating steps performed in an overlay metrology method 600, in accordance with one or more embodiments of the present disclosure. Applicant notes that the embodiments and enabling technologies described previously herein in the context of the overlay metrology system 100 should be interpreted to extend to the method 600. It is further noted, however, that the method 600 is not limited to the architecture of the overlay metrology system 100.

In some embodiments, the method 600 includes a step 602 of generating illumination with an illumination source. In some embodiments, the method 600 includes a step 604 of splitting the illumination from the illumination source into primary illumination and auxiliary illumination. In some embodiments, the method 600 includes a step 606 of directing the primary illumination to an overlay target on a sample to the overlay target, wherein the overlay target includes gratings in two or more layers.

In some embodiments, the method 600 includes a step 608 of overlapping a first portion of the auxiliary illumination with at least one diffraction lobe of the primary illumination by the overlay target on a first photodetector in a collection pupil plane to generate a first interference pattern. In some embodiments, the method 600 includes a step 610 of overlapping a second portion of the auxiliary illumination with at least one additional diffraction lobe of the primary illumination by the overlay target on a second photodetector in the collection pupil plane to generate a second interference pattern. In some embodiments, the method 600 includes a step 612 of modulating phases of the first and second interference patterns during a scan of the overlay target with a scanning sub-system. For example, the scanning sub-system may include at least one of a translation stage to scan the sample with respect to the primary illumination, beam-scanning optics to scan the primary illumination with respect to the sample, or a phase modulator to modulate a phase of the auxiliary illumination.

In some embodiments, the method 600 includes a step 614 of generating time-varying interference signals with the first and second photodetectors based on the modulated phases of the first and second interference patterns. In some embodiments, the method 600 includes a step 616 of generating one or more overlay measurements of the overlay target based on the time-varying interference signals.

It is contemplated herein that the method 600 may be used to generate overlay metrology measurements on any overlay target design and associated metrology recipe suitable for scanning scatterometry overlay metrology. For example, the overlay target may include gratings with common pitches. By way of another example, the overlay target may include gratings with different pitches (e.g., forming a Moiré structure). In this way, the particular diffraction lobes overlapped with the auxiliary illumination (e.g., in steps 608 and 610) may vary based on the particular overlay target design and associated metrology recipe.

Further, it is contemplated herein that the method 600 may be extended to provide simultaneous measurements. For example, the primary illumination and the auxiliary illumination may be split into multiple beams having different illumination conditions (e.g., variations in wavelength, polarization, or other suitable parameter) such that the diffraction lobes associated each illumination condition may be isolated into different channels. In this way, the method 600 may be extended to provide measurements of a single cell with the different illumination conditions or measurements of different cells with the different illumination conditions. In the case of simultaneous measurements of different cells, the different cells may include grating structures with different directions of periodicity (e.g., grating directions) for simultaneous overlay measurements along different direction or may include grating structures with the same directions of periodicity but different grating layouts (e.g., offsets between top and bottom gratings, different pitches configurations between the top and bottom gratings, or the like) to facilitate multi-cell metrology recipes.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
an illumination source;
a first beamsplitter configured to split illumination from the illumination source into primary illumination and auxiliary illumination;
one or more illumination optics configured to direct the primary illumination to an overlay target on a sample when implementing a metrology recipe, wherein the overlay target in accordance with the metrology recipe includes gratings in two or more layers;
an objective lens to collect at least one positive diffraction lobe and at least one negative diffraction lobe associated with diffraction of the primary illumination from the gratings in each of the two or more layers when implementing the metrology recipe;
one or more photodetectors in one or more collection pupil planes;
one or more collection optics configured to implement the metrology recipe by:
overlapping a first portion of the auxiliary illumination with at least one diffraction lobe of the primary illumination by the overlay target on at least one of the one or more photodetectors to generate a first interference pattern; and
overlapping a second portion of the auxiliary illumination with at least one additional diffraction lobe of the primary illumination by the overlay target on at least one of the one or more photodetectors to generate a second interference pattern;
a scanning sub-system including at least one of a translation stage to scan the sample with respect to the primary illumination, beam-scanning optics to scan the primary illumination with respect to the sample, or a phase modulator to modulate a phase of the auxiliary illumination during a scan of the overlay target when implementing the metrology recipe; and
a controller communicatively coupled to the one or more photodetectors, the controller including one or more processors configured to execute program instructions causing the one or more processors to implement the metrology recipe by:
receiving time-varying interference signals from the one or more photodetectors during the scan of the overlay target; and
generating one or more overlay measurements of the overlay target based on the time-varying interference signals.

2. The overlay metrology system of claim 1, wherein the at least one diffraction lobe includes at least one positive diffraction lobe of a selected diffraction order, wherein the at least one additional diffraction lobe includes at least one negative diffraction lobe of the selected diffraction order.

3. The overlay metrology system of claim 1, wherein the primary illumination has a rotated dipole distribution with respect to grating directions of the grating structures on the overlay target.

4. The overlay metrology system of claim 1, wherein the overlay target in accordance with the metrology recipe includes:
a first cell including a grating with a pitch P on a first layer and a grating with a pitch Q on a second layer to form a first Moiré structure; and a second cell including a grating with the pitch Q on the first layer and a grating with the pitch P on the second layer to form a second Moiré structure;

wherein the one or more collection optics are configured to implement the metrology recipe by:

overlapping the first portion of the auxiliary illumination with both a +1 diffraction lobe and a positive Moiré diffraction lobe of the primary illumination by the overlay target on at least one of the one or more photodetectors to generate the first interference pattern; and overlapping the second portion of the auxiliary illumination with both a −1 diffraction lobe and a negative Moiré diffraction lobe of the primary illumination by the overlay target on at least one of the one or more photodetectors to generate the second interference pattern.

5. The overlay metrology system of claim 1, wherein the overlay target in accordance with the metrology recipe includes:

a cell including one or more gratings having first and second pitches on a first layer and a grating having a third pitch on a second layer;

wherein the one or more collection optics are configured to implement the metrology recipe by:

overlapping the first portion of the auxiliary illumination with +1 diffraction orders from the first, second, and third pitches on at least one of the one or more photodetectors to generate the first interference pattern; and overlapping the second portion of the auxiliary illumination with −1 diffraction orders from the first, second, and third pitches on at least one of the one or more photodetectors to generate the second interference pattern.

6. The overlay metrology system of claim 1, wherein the overlay target in accordance with the metrology recipe includes:

a cell including a grating with a first pitch on a first layer and a grating with a second pitch on a second layer; and wherein the one or more collection optics are configured to implement the metrology recipe by:

overlapping a first portion of the auxiliary illumination with +1 and +2 diffraction orders from the first pitch along with +1 diffraction from the second pitch on at least one of the one or more photodetectors to generate the first interference pattern; and overlapping a second portion of the auxiliary illumination with −1 and −2 diffraction orders from the first pitch along with −1 diffraction from the second pitch on at least one of the one or more photodetectors to generate the second interference pattern.

7. The overlay metrology system of claim 1, wherein the one or more photodetectors comprise:

one or more phase-locked photodetectors locked to a frequency of the time-varying interference signals, wherein generating the one or more overlay measurements of the overlay target based on the time-varying interference signals comprises:

extracting at least one of intensity or phase information associated with the time-varying interference signals using a phase locking technique; and determining overlay error between the two or more layers of the sample based on the at least one of the intensity or the phase information.

8. The overlay metrology system of claim 1, wherein generating the one or more overlay measurements of the overlay target based on the time-varying interference signals comprises:

extracting at least one of intensity or phase information associated with the time-varying interference signals using a Fourier analysis technique; and determining overlay error between the two layers of the sample based on the at least one of the intensity or the phase information.

9. The overlay metrology system of claim 1, wherein the one or more illumination optics direct the primary illumination to the overlay target at a normal incidence angle.

10. The overlay metrology system of claim 1, wherein the illumination from the illumination source is spatially coherent.

11. An overlay metrology method comprising:

generating illumination with an illumination source;

splitting the illumination from the illumination source into primary illumination and auxiliary illumination;

directing the primary illumination to an overlay target on a sample, wherein the overlay target includes gratings in two or more layers;

overlapping a first portion of the auxiliary illumination with at least one diffraction lobe associated with diffraction of the primary illumination from the gratings in each of the two or more layers on one or more first photodetectors in a collection pupil plane to generate a first interference pattern;

overlapping a second portion of the auxiliary illumination with at least one additional diffraction lobe associated with the diffraction of the primary illumination from the gratings in each of the two or more layers on one or more second photodetectors in the collection pupil plane to generate a second interference pattern;

modulating phases of the first and second interference patterns during a scan of the overlay target with a scanning sub-system, wherein the scanning sub-system includes at least one of a translation stage to scan the sample with respect to the primary illumination, beam-scanning optics to scan the primary illumination with respect to the sample, or a phase modulator to modulate a phase of the auxiliary illumination;

generating time-varying interference signals with the one or more first photodetectors and the one or more second photodetectors based the modulated phases of the first and second interference patterns; and generating one or more overlay measurements of the overlay target based on the time-varying interference signals.

12. The overlay metrology method of claim 11, wherein overlapping the first portion of the auxiliary illumination with the at least one diffraction lobe associated with diffraction of the primary illumination from the gratings in each of the two or more layers on the one or more first photodetectors in the collection pupil plane to generate the first interference pattern comprises:

overlapping the first portion of the auxiliary illumination with at least one positive diffraction lobe of a selected diffraction order associated with diffraction of the primary illumination from the gratings in each of the two or more layers on the one or more first photodetectors in the collection pupil plane to generate the first interference pattern.

13. The overlay metrology method of claim 11, wherein overlapping the second portion of the auxiliary illumination with the at least one additional diffraction lobe associated with the diffraction of the primary illumination from the gratings in each of the two or more layers on the one or more second photodetectors in the collection pupil plane to generate the second interference pattern comprises:
   overlapping the second portion of the auxiliary illumination with at least one negative diffraction lobe of the selected diffraction order associated with the diffraction of the primary illumination from the gratings in each of the two or more layers on the one or more second photodetectors in the collection pupil plane to generate the second interference pattern.

14. The overlay metrology method of claim 11, wherein the overlay target includes:
   a first cell including a grating with a pitch P on a first layer and a grating with a pitch Q on a second layer to form a first Moiré structure; and
   a second cell including a grating with the pitch Q on the first layer and a grating with the pitch P on the second layer to form a second Moiré structure;
   wherein the one or more collection optics are configured to implement the metrology recipe by:
   overlapping the first portion of the auxiliary illumination with both a +1 diffraction lobe and a positive Moiré diffraction lobe of the primary illumination by the overlay target on at least one of the one or more photodetectors to generate the first interference pattern; and
   overlapping the second portion of the auxiliary illumination with both a −1 diffraction lobe and a negative Moiré diffraction lobe of the primary illumination by the overlay target on at least one of the one or more photodetectors to generate the second interference pattern.

15. The overlay metrology method of claim 11, wherein the overlay target includes:
   a cell including one or more gratings having first and second pitches on a first layer and a grating having a third pitch on a second layer;
   wherein the one or more collection optics are configured to implement the metrology recipe by:
   overlapping the first portion of the auxiliary illumination with +1 diffraction orders from the first, second, and third pitches on at least one of the one or more photodetectors to generate the first interference pattern; and
   overlapping the second portion of the auxiliary illumination with −1 diffraction orders from the first, second, and third pitches on at least one of the one or more photodetectors to generate the second interference pattern.

16. The overlay metrology method of claim 11, wherein the overlay target includes:
   a cell including a grating with a first pitch on a first layer and a grating with a second pitch on a second layer; and
   wherein the one or more collection optics are configured to implement the metrology recipe by:
   overlapping a first portion of the auxiliary illumination with +1 and +2 diffraction orders from the first pitch along with +1 diffraction from the second pitch on at least one of the one or more photodetectors to generate the first interference pattern; and
   overlapping a second portion of the auxiliary illumination with −1 and −2 diffraction orders from the first pitch along with −1 diffraction from the second pitch on at least one of the one or more photodetectors to generate the second interference pattern.

17. An overlay metrology system comprising:
   an illumination source configured to generate an illumination;
   one or more beamsplitters configured to split the illumination from the illumination source into primary illumination and auxiliary illumination;
   one or more illumination optics configured to direct the primary illumination to an overlay target on a sample, the overlay target having gratings in two or more layers when implementing a metrology recipe, wherein the overlay target in accordance with the metrology recipe includes a first set of one or more cells with gratings having a first grating direction and a second set of one or more cells with gratings having a second grating direction, wherein the primary illumination has a rotated quadrupole distribution with respect to the first and second grating directions;
   an objective lens to collect at least one positive diffraction lobe and at least one negative diffraction lobe associated with diffraction of the primary illumination from the gratings in each of the two or more layers when implementing the metrology recipe;
   a first collection channel comprising:
      a first set of one or more photodetectors in one or more collection pupil planes;
      one or more first collection optics configured to implement the metrology recipe by:
      overlapping a first portion of the auxiliary illumination with at least one diffraction lobe of the primary illumination along a first diagonal of the rotated quadrupole distribution by the overlay target on at least one of the first set of one or more photodetectors to generate a first interference pattern; and
      overlapping a second portion of the auxiliary illumination with at least one additional diffraction lobe of the primary illumination along the first diagonal of the rotated quadrupole distribution by the overlay target on at least one of the first set of one or more photodetectors to generate a second interference pattern;
   a second collection channel comprising:
      a second set of one or more photodetectors in one or more collection pupil planes;
      one or more second collection optics configured to implement the metrology recipe by:
      overlapping a first portion of the auxiliary illumination with at least one diffraction lobe of the primary illumination along a second diagonal of the rotated quadrupole distribution by the overlay target on the at least one of the second set of one or more photodetectors to generate a third interference pattern; and
      overlapping a second portion of the auxiliary illumination with at least one additional diffraction lobe of the primary illumination along the second diagonal of the rotated quadrupole distribution by the overlay target on at least one of the second set of one or more photodetectors to generate a fourth interference pattern;
   a scanning sub-system configured to modulate phases of the first, second, third, and fourth interference patterns during a scan of the overlay target when implementing the metrology recipe, wherein the scanning sub-system includes at least one of a translation stage to scan the sample with respect to the primary illumination, beam-scanning optics to scan the primary illumination with respect to the sample, or a phase modulator to modulate a phase of the auxiliary illumination; and a controller communicatively coupled to the first and second photodetectors, the controller including one or more processors configured to execute program instructions causing the one or more processors to implement the metrology recipe by:

receiving time-varying interference signals from the first and second collection channels during the scan of the overlay target; and generating one or more overlay measurements of the overlay target along the first and second grating directions based on the time-varying interference signals.

18. The overlay metrology system of claim 17, wherein the at least one diffraction lobe of the primary illumination along the first diagonal of the rotated quadrupole distribution includes at least one positive diffraction lobe of a selected diffraction order, wherein the at least one additional diffraction lobe of the primary illumination along the first diagonal of the rotated quadrupole distribution includes at least one negative diffraction lobe of the selected diffraction order, wherein the at least one diffraction lobe of the primary illumination along the second diagonal of the rotated quadrupole distribution includes at least one positive diffraction lobe of the selected diffraction order, wherein the at least one additional diffraction lobe of the primary illumination along the second diagonal of the rotated quadrupole distribution includes at least one negative diffraction lobe of the selected diffraction order.

19. The overlay metrology system of claim 17, wherein illumination lobes of the first diagonal of the rotated quadrupole distribution are distinguished from illumination lobes of the second diagonal of the rotated quadrupole distribution by at least one of a wavelength or a polarization.

20. The overlay metrology system of claim 17, wherein the one or more illumination optics direct the primary illumination to the overlay target at an oblique incidence angle.

21. The overlay metrology system of claim 17, wherein the illumination from the illumination source is spatially coherent.

* * * * *